(12) United States Patent
McDonnell et al.

(10) Patent No.: US 6,348,862 B1
(45) Date of Patent: Feb. 19, 2002

(54) PROXIMITY SENSOR

(75) Inventors: Judson G. McDonnell, Farmington Hills; James G. Stanley, Novi, both of MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 09/520,866

(22) Filed: Mar. 6, 2000

Related U.S. Application Data

(60) Provisional application No. 60/123,006, filed on Mar. 5, 1999, and provisional application No. 60/144,161, filed on Jul. 18, 1999.

(51) Int. Cl.$^7$ .............................................. G08B 13/26
(52) U.S. Cl. ................ 340/562; 180/272; 280/735; 340/561
(58) Field of Search ................. 340/562, 561, 340/573.1, 657; 180/272; 280/735; 307/10.1; 701/45; 324/688; 361/748, 170

(56) References Cited

U.S. PATENT DOCUMENTS

| | | | |
|---|---|---|---|
| 3,111,608 A | 11/1963 | Boenning et al. ............ 361/179 |
| 3,177,481 A | 4/1965 | Joy et al. ................. 246/167 R |
| 3,237,105 A | 2/1966 | Kalmus ....................... 340/562 |
| 3,324,848 A | 6/1967 | Domeier et al. ............. 600/535 |
| 3,439,358 A | 4/1969 | Salmons ..................... 340/552 |
| 3,740,567 A | 6/1973 | Atkins ..................... 307/10 SB |
| 3,898,472 A | 8/1975 | Long ...................... 307/10 SB |
| 3,943,376 A | 3/1976 | Long ........................... 307/116 |
| 4,300,116 A | 11/1981 | Stahovec ...................... 340/32 |
| 4,430,645 A | 2/1984 | Eskandry et al. ............ 340/572 |
| 4,586,260 A | 5/1986 | Baxter et al. .................. 33/125 |
| 4,766,368 A | 8/1988 | Cox ........................... 324/61 P |
| 4,796,013 A | 1/1989 | Yasuda et al. ............... 340/562 |
| 4,831,279 A | 5/1989 | Ingraham ..................... 307/116 |
| 4,853,617 A | 8/1989 | Douglas et al. ................ 324/67 |
| 4,887,024 A | 12/1989 | Sugiyama et al. ........... 324/674 |
| 4,980,519 A | 12/1990 | Mathews ....................... 178/19 |
| 5,247,281 A | 9/1993 | Facon et al. ................. 340/562 |
| 5,363,051 A | 11/1994 | Jenstrom et al. ............ 324/661 |

(List continued on next page.)

OTHER PUBLICATIONS

Fink, Donald G. and Beaty, H. W.; Standard Handbook for Electrical Engineers 12th ed., McGraw–Hill Book Co, 1987, pp. 3–57 through 3–65.

Smith, J.R.; "Field Mice: Extracting hand geometry from electric field measurements", IBM Systems Journal, vol. 35. NOS. 3&4, 1996.

Reference Data for Engineers: Radio, Electronics, Computer, and Communications 7th edition, E.C. Jordon editor in chief, Howard W. Sams, 1985, pp. 12–3 through 12–12.

Jinno K.; Ofuji, M.; Saito, T.; Sekido, S.; "Occupant Sensing Utilizing Perturbation of Electric Fields", SAE 971051, Reprinted from: Anthropomorphic Dummies and Crash Instrumentation Sensors (SP–1261), SAE International Congress & Exposition, Detroit, MI Feb. 24–27, 1997.

*Primary Examiner*—Thomas Mullen
(74) *Attorney, Agent, or Firm*—Dinnin & Dunn P.C.

(57) ABSTRACT

A sense electrode (12) and a plurality of control electrodes (14) are located proximate to a region of space (18) for sensing an object (20) therein. A first signal (26) and a plurality of second signals (30) respectively applied to the sense (12) and control (14) electrodes generate an electric field (16) within the region of space (18). The capacitance of the sense electrode (12) is measured for various electric field configurations responsive to the second signals (30) and to the proximity of the object (20). A most likely proximity scenario from a priori proximity scenarios is determined from the plurality of capacitance measurements. A front driven shield (36) is provided between the sense electrode (12) and the region of space (18) for selectively shielding the sense electrode (12) from influence by objects (20) or grounds, so as to provide for calibrating the measurement circuit (32) to compensate for parasitic capacitance and gain drift.

26 Claims, 12 Drawing Sheets

U.S. PATENT DOCUMENTS

| | | | |
|---|---|---|---|
| 5,373,245 A | 12/1994 | Vranish | 324/662 |
| 5,442,347 A | 8/1995 | Vranish | 340/870.37 |
| 5,446,391 A | 8/1995 | Aoki et al. | 324/661 |
| 5,525,843 A | 6/1996 | Howing | 307/9.1 |
| 5,539,292 A | 7/1996 | Vranish | 318/568.21 |
| 5,602,734 A | 2/1997 | Kithil | 364/424.055 |
| 5,654,643 A | 8/1997 | Bechtel et al. | 324/687 |
| 5,691,693 A | 11/1997 | Kithil | 340/439 |
| 5,722,686 A | 3/1998 | Blackburn et al. | 280/735 |
| 5,724,024 A | 3/1998 | Sonderegger et al. | 340/562 |
| 5,726,581 A | 3/1998 | Vranish | 324/688 |
| 5,770,997 A | 6/1998 | Kleinberg et al. | 280/235 |
| 5,793,176 A | 8/1998 | Novak | 318/587 |
| 5,802,479 A | 9/1998 | Kithill et al. | 701/45 |
| 5,844,415 A | 12/1998 | Gershenfeld et al. | 324/663 |
| 5,844,486 A | 12/1998 | Kithil et al. | 340/573 |
| 5,871,232 A | 2/1999 | White | 280/735 |
| 5,914,610 A | 6/1999 | Gershenfeld et al. | 324/663 |
| 5,948,031 A | 9/1999 | Jinno et al. | 701/45 |
| 5,964,478 A | 10/1999 | Stanley et al. | 280/735 |
| 6,014,602 A | 1/2000 | Kithil et al. | 701/45 |
| 6,031,380 A | 2/2000 | Gleixner et al. | 324/683 |
| 6,043,743 A | 3/2000 | Saito et al. | 340/562 |
| 6,079,738 A | 6/2000 | Lotito et al. | 280/735 |
| 6,094,610 A | 7/2000 | Steffens, Jr. et al. | 701/45 |

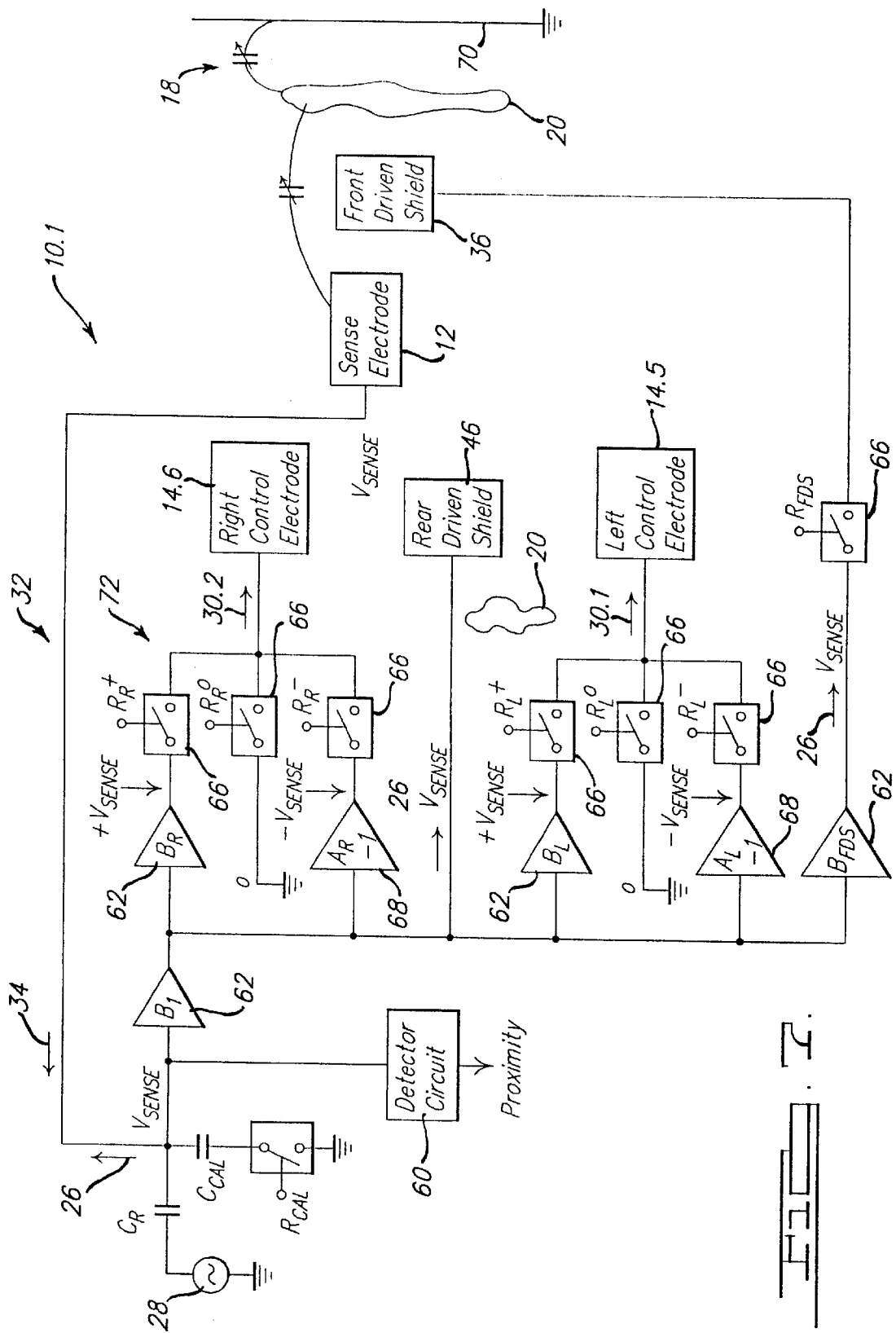

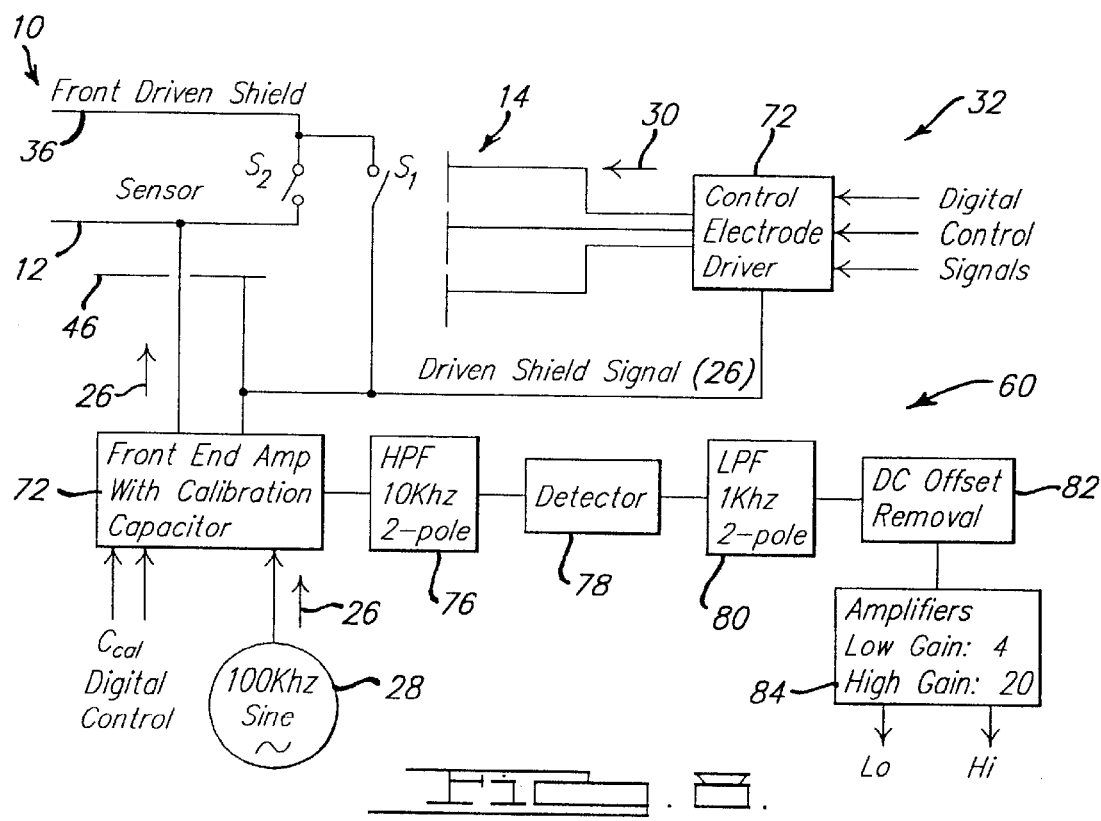
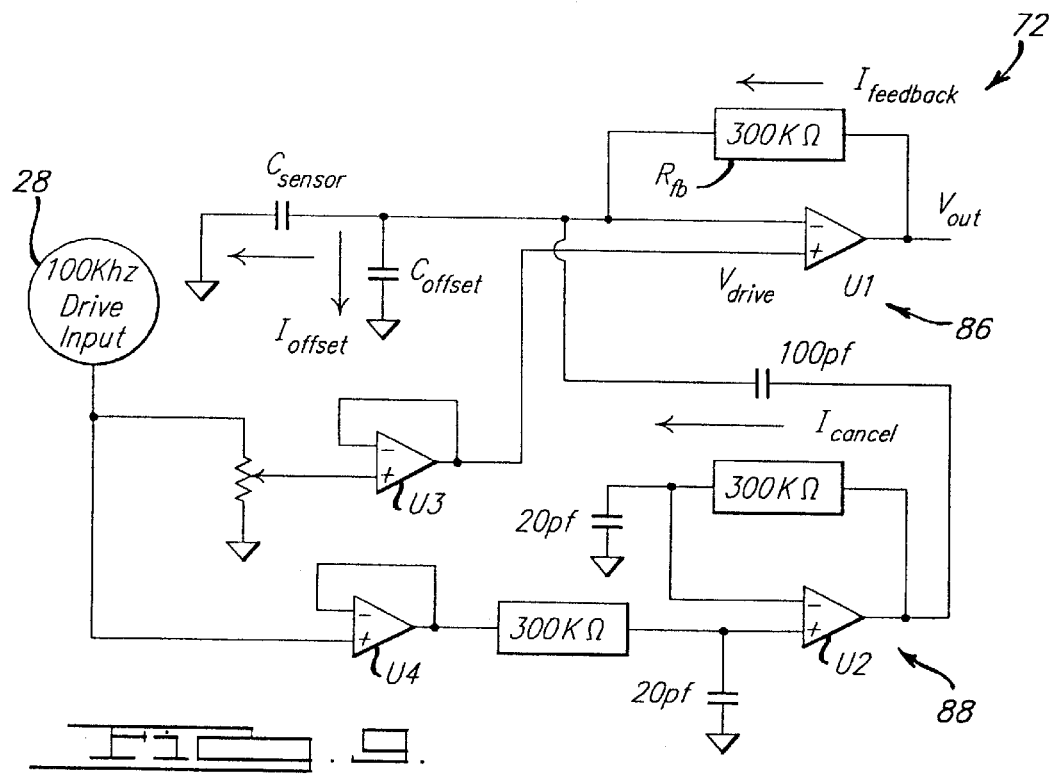

Distance

PROXIMITY SENSOR

CROSS-REFERENCE TO RELATED APPLICATIONS

The instant application claims the benefit of prior U.S. Provisional Application Ser. No. 60/123,006 filed on Mar. 5, 1999.

The instant application also claims the benefit of prior U.S. Provisional Application Ser. No. 60/144,161 filed on Jul. 18, 1999.

TECHNICAL ART

The instant invention generally relates to proximity sensors, and more particularly to proximity sensors that are responsive to an electric-field-influencing media.

BACKGROUND OF THE INVENTION

A variety of systems have been developed to suppress the passenger air bag in dangerous situations. Systems have included sensors used alone or in combinations. Sensor technologies used include:

a) Infra-red sensors b) Passive infra-red sensors (heat detectors)

c) Ultrasonic sensors d) Capacitive sensors (usually using a different type of capacitive sensor)

e) Weight sensors (including various sensor technologies and measurement methods)

f) Child seat "tag" sensors

Usually two or more of these sensors are used together in an attempt to identify child seats, small occupants, empty seats, large occupants and out-of-position occupants. The more sensors that are used, the better the chance for a high performance system. The costs of systems that use many sensors however, can become prohibitively high because of the large number of components and the increased assembly complexity of the vehicle.

The prior art also teaches the use of capacitive sensing to detect the presence, proximity, or position of an occupant. U.S. Pat. No. 3,740,567 teaches the use of electrodes incorporated into the base and back of the seat respectively, together with a capacitance responsive circuit, for purposes of discriminating between human occupants and animals or packages resting on an automobile seat. U.S. Pat. No. 3,898,472 teaches an occupant detection apparatus which includes a metallic electrode which is disposed to cooperate with the body of an automobile to form an occupant sensing capacitor, together with related circuitry which senses variations in the associated capacitance responsive to the presence of an occupant. U.S. Pat. No. 4,300,116 teaches the use of a capacitive sensor to detect people proximate the exterior of a vehicle. U.S. Pat. No. 4,796,013 teaches a capacitive occupancy detector wherein the capacitance is sensed between the base of the seat and the roof of the vehicle. U.S. Pat. No. 4,831,279 teaches a capacity responsive control circuit for detecting transient capacitive changes related to the presence of a person. U.S. Pat. Nos. 4,980,519 and 5,214,388 teach the use of an array of capacitive sensors for detecting the proximity of an object. U.S. Pat. No. 5,247,261 teaches the use of an electric field responsive sensor to measure the position of a point with respect to at least one axis. U.S. Pat. No. 5,411,289 teaches the use of a capacitive sensor incorporated into the back rest of the seat to detect occupant presence. U.S. Pat. No. 5,525,843 teaches the use of electrodes incorporated into the base and back of the seat for purpose of detecting the presence of an occupant, whereby the electrodes are substantially insulated from the vehicle chassis when the detection circuit is active. U.S. Pat. Nos. 5,602,734 and 5,802,479 teach an array of electrodes mounted above the occupant for purposes of sensing occupant position based upon the influence of the occupant on the capacitance amongst the electrodes. U.S. Pat. No. 5,166,679 teaches a capacitive proximity sensor with a reflector driven at the same voltage as to sensing element to modify the sensing characteristic of the sensor. U.S. Pat. No. 5,770,997 teaches a capacitive vehicle occupant position sensing system wherein the sensor generates a reflected electric field for generating an output signal indicative of the presence of an object. U.S. Pat. Nos. 3,943,376, 3,898,472, 5,722,686, and 5,724,024 also teach capacitive-based systems for sensing occupants in motor vehicles.

In addition to methods taught by the above referenced U.S. Patents, the prior art also teaches various means of measuring capacitance, as for example given in the *Standard Handbook for Electrical Engineers* $12^{th}$ edition, D. G. Fink and H. W. Beaty editors, McGraw Hill, 1987, pp. 3–57 through 3–65 or in Reference Data for Engineers: Radio, Electronics, Computer, and Communications $7^{th}$ edition, E. C. Jordon editor in chief, Howard W. Sams, 1985, pp. 12-3 through 12-12, both included herein by reference.

The technical paper "Field mice: Extracting hand geometry from electric field measurements" by J. R. Smith, published in IBM Systems Journal, Vol. 35, Nos. 3 & 4, 1996, pp. 587–608, incorporated herein by reference, describes the concept of Electric Field Sensing as used for making non-contact three-dimensional position measurements, and more particularly for sensing the position of a human hand for purposes of providing three dimensional positional inputs to a computer. What has commonly been referred to as capacitive sensing actually comprises the distinct mechanisms of what the author refers to as "loading mode", "shunt mode", and "transmit mode" which correspond to various possible electric current pathways. In the shunt mode, a voltage oscillating at low frequency is applied to a transmit electrode, and the displacement current induced at a receive electrode is measured with a current amplifier, whereby the displacement current may be modified by the body being sensed. In the "loading mode", the object to be sensed modifies the capacitance of a transmit electrode relative to ground. In the transmit mode, the transmit electrode is put in contact with the user's body, which then becomes a transmitter relative to a receiver, either by direct electrical connection or via capacitive coupling.

There are many technologies—including ultrasonic, active infrared, and passive infrared—that have been used for sensing the position of an occupant in a motor vehicle. Some of the problems associated with ultrasonic sensors include: poor reflections off some clothing types, relatively slow pulse propagation times, susceptibility to acoustic noise, and blockage by a newspaper. Some of the problems associated with active infrared sensors include: poor reflections off some clothing types, signal saturation as a result of extreme sunlight conditions, and blockage by a newspaper. Some of the problems associated with passive infrared sensors include: poor signal as a result of occupant's clothing, poor contrast because of ambient temperature, and difficulty in making direct distance measurements.

In an elementary capacitive sensor a metal electrode is connected to a capacitance measuring circuit. Whereas many variations of capacitive sensors are taught in the related art for the occupant sensing application, one problem with known capacitive sensors is a relatively low signal to noise ratio that can be caused by uncertainty in measurement offsets, particularly when sensing very low levels of capacitance, for which the noise resulting from signal drift can overwhelm the signal in static situations where the target is at a distance that would cause only a small change in the capacitance. This can limit the useful range of position measurements that can be reliably sensed by the sensor. Drifts in the offset may result from drift in the measurement electronics or in the connection to the sensing electrode. Furthermore, known single electrode capacitive sensors measure a single value representing a summation of the total capacitance to ground in all directions, including to the rear of the sensor, from which it is difficult or impossible to obtain an accurate idea of an object's location relative to sensor.

SUMMARY OF THE INVENTION

The instant invention overcomes the above-noted problems by providing—in a first aspect—a proximity sensor for sensing an electric-field-influencing media within a region of space, comprising a first electrode, at least one second electrode, a first oscillatory signal operatively connected to the first electrode, at least one second oscillatory signal operatively connected to the at least one second electrode, and a circuit operatively connected to the first electrode for sensing a third signal from the first electrode and for generating a measure of the proximity of the electric-field-influencing media to the first electrode. The first electrode functions as a sense electrode, and the at least one sense electrode functions as at least one control electrode.

The first and at least one second electrodes are conductive and are preferably disposed on a common, first surface, wherein the at least one second electrode is disposed outside a periphery of the first electrode. The at least one second electrode is located proximate to the first electrode so that an electric field between the first electrode and the at least one second electrode occupies the region of space to be sensed. The electric field is generated by the first and at least one second electrodes responsive to the first and the at least one second oscillatory signals, the latter of which provides for varying the geometry of the electric field.

The at least one second oscillatory signal is coherent with the first oscillatory signal, and comprises a plurality of second signal components, each component comprising a specific signal level or signal phase at a distinct time.

Preferably, the at least one second electrode comprises a plurality of second electrodes, each isolated from one another, all surrounding the first electrode, and the corresponding at least one second oscillatory signal comprises a plurality of second oscillatory signals that are operatively connected to respective second electrodes of the plurality of second electrodes. In one embodiment, the second signal components are either in-phase or out-of-phase relative with the first oscillatory signal. Moreover, the respective series of second signal components to the respective second electrodes are independent of one another with respect to either signal level or signal phase.

The third signal comprises a plurality of third signal components, each of which is respectively responsive to the first oscillatory signal, the respective second signal component, and to a proximity to the first electrode of the electric-field-influencing media For the first and at least one second oscillatory signals comprising voltage signals, the third signal comprises a current signal. Alternately, for the first and at least one second oscillatory signals comprising current signals, the third signal comprises a voltage signal. Generally, the third signal provides a measure of the capacitance of the first electrode. The circuit generates a plurality of measures from the plurality of third signal components, and generates a likelihood of a proximity scenario responsive to the plurality of measures, wherein the proximity scenario is indicative of a proximity of the electric-field-influencing media to the first electrode. Preferably, the circuit generates a respective plurality of the likelihoods for a respective plurality of proximity scenarios, and selects a most likely proximity scenario from the plurality of proximity scenarios.

In accordance with the first aspect, the instant invention provides a method of sensing the proximity of an electric-field-influencing media within a region of space comprising applying a first oscillatory signal to a first electrode, applying at least one second oscillatory signal to a respective at least one second electrode, and sensing a third signal from the first electrode. The first electrode functions as a sense electrode and the at least one second electrode functions as at least one control electrode. The at least one second oscillatory signal comprises a plurality of second signal components each comprising a distinct signal level or signal phase relative to a phase at a distinct time. Preferably a plurality of second oscillatory signals are applied to a respective plurality of second electrodes. The third signal comprises a plurality of third signal components, each respectively responsive to a different respective second signal component. The method further comprises generating a plurality of measures from the plurality of third signal components, establishing a plurality of proximity scenarios, generating a plurality of likelihoods from the plurality of measures, and selecting a most likely proximity scenario from the plurality of proximity scenarios. Each proximity scenario comprises a different proximity, or location, of the electric-field-influencing media to the first electrode, and each respective likelihood is the likelihood of the respective proximity scenario.

The control electrodes provide for modifying the geometry of the electric field of the proximity sensor, so as to enable objects to be to be detected proximate in all directions relative to the sensor, including above or below, or left or right depending upon the control electrode configuration, wherein the electric field created by the sense and control electrodes is modified by the control signals so as to probe the space proximate to the proximity sensor. The response to a particular electric field configuration is measured from the current of the voltage signal applied to the sense electrode. Different electric field configurations provide for different associated sensitivity patterns of the capacitance of the sense electrode to a surrounding ground, responsive to objects in a region of space proximate to the proximity sensor, wherein the objects comprise electric-field-influencing media. By measuring the capacitance of the sense electrode for the control electrodes at various potentials relative to the sensor electrode, a plurality of independent capacitance values are obtained, from which, in combination, the spatial location of an object proximate to the sensor is determined relative to a set of a priori proximity scenarios using a probabilistic algorithm employing Bayes rule. The type and location of an object sensed by the proximity sensor is given by the object type and location associated with the most likely proximity scenario determined from the combination of capacitance measurements.

Larger numbers of independent capacitance measurements and a priori proximity scenarios provide for a more detailed measurement of the type and location of an unknown target or targets proximate to the proximity sensor.

Changes of capacitance resulting from target movement can also be used to increase confidence in the measured target location, because the sensitivity of the capacitance of the sense electrode to changes in object location is generally different for different electric field configurations. Moreover, changes in capacitance are relatively easy to measure, because they are not affected by capacitance offsets in the system. However, target movement, which cannot be controlled, is not generally suitable for the initial proximity measurements.

Depending on the application, the sensor response may be optimized by changing the sense electrode size, the number and sizes of the control electrodes, and/or the gap width.

In accordance with a second aspect of the instant invention, a proximity sensor for sensing an electric-field-influencing media within a region of space comprises a first electrode having first and second sides, a first oscillatory signal operatively connected to the first electrode; and a third electrode proximate to and insulated from the first side of the first electrode, located between the first side of the first electrode and the region to be sensed. The first and third electrodes are each conductive, are disposed on respective first and second surfaces, and preferably have substantially equal boundaries.

In a shielding mode, the third electrode is operatively connected to the first oscillatory signal. In a sensing mode, a third signal from the first electrode is responsive to the first oscillatory signal and to a proximity to the first side of the first electrode of the electric-field-influencing media. For the first signal comprising a voltage signal, the third signal comprises a current signal. Alternately, for the first signal comprising a current signal, the third signal comprises a voltage signal. Generally, the third signal provides a measure of the capacitance of the first electrode. In the sensing mode, the third electrode is either operatively connected to the first electrode, or is electrically floating.

The second aspect further provides for a fourth electrode proximate to and insulated from the second side of the first electrode, having a boundary that extends up to and preferably beyond the boundary of the first electrode. The fourth electrode is conductive, and is disposed on a third surface, wherein the second and third surfaces are preferably substantially parallel to the first surface. The fourth electrode is operatively coupled to the first oscillatory signal so as to shield the first electrode from the influence of an electric-field-influencing media proximate to the second side of the first electrode.

In accordance with the second aspect, the instant invention provides a method of sensing the proximity of an electric-field-influencing media within a region of space comprising applying a first oscillatory signal to a first electrode having first and second sides; in a shielding mode, applying the first oscillatory signal to a third electrode, wherein the third electrode is located between the first side of the first electrode and the region of space; and in a sensing mode, sensing a signal from the first electrode responsive to the proximity of an electric-field-influencing media to the first electrode, wherein the sensing and the shielding modes are mutually exclusive. The first electrode functions as a sense electrode, and the third electrode functions as a front driven shield. In the sensing mode, the third electrode is either operatively connected to the first electrode or is isolated from the first electrode. The method further comprises applying the first oscillatory signal to a fourth electrode located proximate to the second side of the first electrode, wherein the fourth electrode functions as a rear driven shield.

The front and rear driven shields effectively cancel the capacitance of the sense electrode to ground, on the side of the sense electrode where the driven shield is operative. This cancellation results because both the sense electrode and the driven shield have the same potential so as to prevent any displacement current therebetween. The rear driven shield cancels the capacitance of the sense electrode with objects or grounds behind the sense electrode. The front driven shield cancels the capacitance of the sense electrode with objects or grounds in the target region in front of the sensor, thereby enabling the sensor to ignore targets and thereby enable the associated circuit to characterize the associated parasitic capacitance during a calibration process using a known capacitance of an associated calibration capacitor. The calibration capacitor may be a discrete capacitor in the circuit, or it could be a capacitance from the sensor, e.g. a portion of the front driven shield that could be grounded. This calibration process extends the useful range of the proximity sensor. Moreover, when used in conjunction with the front and rear driven shields, this calibration process can be conducted at various times so as to characterize and compensate for drift of parasitic capacitance and circuit gain, or to identify system failures. The front driven shield is either connected to the sense electrode or is electrically floating during the measurement process, wherein the electric-field-influencing media being sensed respectively influences the sense electrode by either conduction or induction.

Accordingly, one object of the instant invention is to provide a proximity sensor with an expanded sensing range.

A further object of the instant invention is to provide a proximity sensor with reduced sensitivity to parasitic capacitance and to associated drifts in parasitic capacitance and circuit gain over time.

A yet further object of the instant invention is to provide a proximity sensor with an improved signal to noise ratio.

A yet further object of the instant invention is to provide a proximity sensor that can determine the presence and location of electric-field-influencing media proximate to the sensor.

A yet further object of the instant invention is to provide a proximity sensor that is insensitive to electric-field-influencing media located behind the sensor, outside the sensing region.

The specific features of the instant invention provide a number of associated advantages. One advantage of the instant invention with respect to the prior art is that the front and rear driven shields enable the proximity sensor to be calibrated so as to compensate for parasitic capacitance and gain drift, thereby improving the signal to noise ratio and range of associated proximity measurements.

Another advantage of the instant invention is that the feature of making all capacitance measurements from a single sense electrode simplifies the associated measurement circuit and improves accuracy by eliminating the need for a switching network between the measurement circuit and the various electrodes.

Yet another advantage of the instant invention is that by applying a plurality of control signals to at least one control electrode and thereby generate a plurality of different electric field configurations, each providing a distinct response from the sense electrode to an object within the electric field, the instant invention provides a plurality of capacitance measurements by which the object can be located relative to the proximity sensor.

Yet another advantage of the instant invention is that by measuring the proximity of objects using a sensor responsive to the electric-field-influencing properties of an object, the instant invention is relatively insensitive to objects such as newspapers or other obstructions that have relatively little influence on an electric field, but which would otherwise affect other proximity sensors such as ultra-sonic or infrared ranging sensors.

When applied as an occupant sensor in a safety restraint system, for example when mounted proximate to an air bag inflator so as to sense the region of space proximate thereto, the spatial and distance measurements from the proximity sensor of the instant invention provide for a determination of whether an occupant is in an "at-risk zone" proximate to the air bag inflator—and thereby at risk of injury from a deployment thereof—so that the air bag inflator may be disabled if an occupant is within the "at-risk zone".

These and other objects, features, and advantages of the instant invention will be more fully understood after reading the following detailed description of the preferred embodiment with reference to the accompanying drawings and viewed in accordance with the appended claims.

BRIEF DESCRIPTION OF THE DRAWINGS

FIG. 5a illustrates a plot of isopotentials for the second embodiment of the instant invention in accordance with the signal levels tabulated in FIG. 5b;

FIG. 5b illustrates a table of signal levels associated with the FIG. 5a;

FIG. 6b illustrates a table of signal levels associated with the FIG. 6a;

FIG. 7 illustrates a block diagram of a circuit in accordance with the instant invention;

FIG. 8 illustrates a block diagram of a circuit in accordance with the instant invention;

FIG. 9 illustrates a front-end amplifier with an offset canceling circuit in accordance with the circuit of FIG. 8;

DETAILED DESCRIPTION OF THE PREFERRED EMBODIMENT(S)

Figure 1:
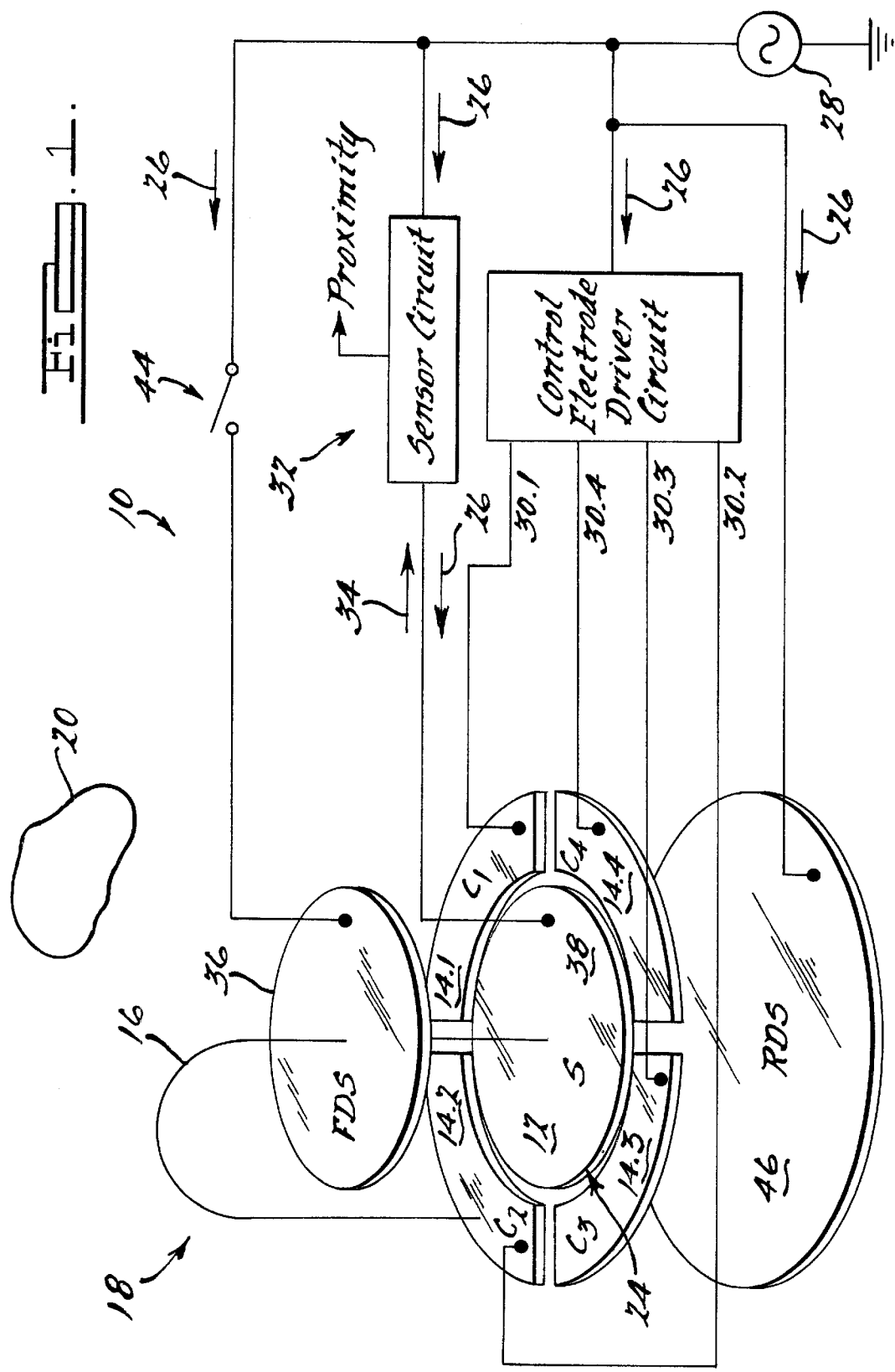
FIG. 1 illustrates a block diagram of the instant invention including an exploded view of the associated electrodes.
Figure 2:
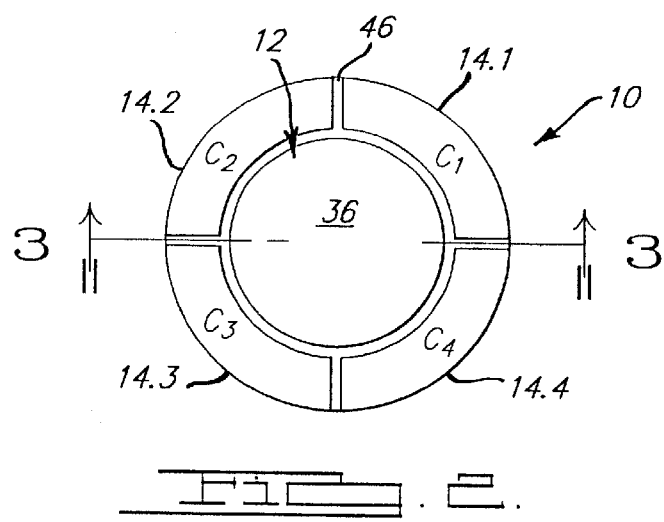
FIG. 2 illustrates a plan view of an electrode assembly in accordance with the instant invention.
Figure 3:
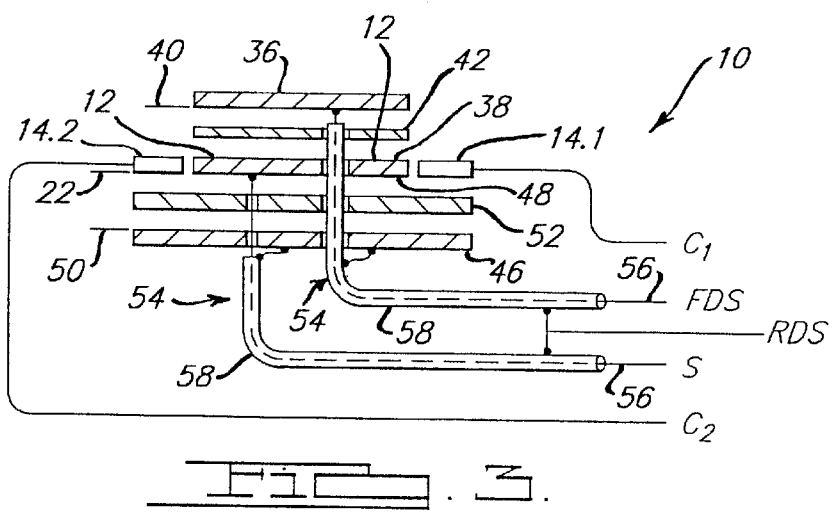
FIG. 3 illustrates a cross-sectional view of the electrode assembly of FIG. 2.

Referring to FIGS. 1–3, a first aspect of the instant invention provides a proximity sensor 10 comprising a conductive sense electrode 12—a first electrode,—and a plurality of conductive control electrodes 14.1, 14.2, 14.3 and 14.4—at least one second electrode, preferably a plurality of second electrodes,—separated therefrom and located proximate thereto, so that an electric field 16 between the sense electrode 12 and at least one of the control electrodes 14.1, 14.2, 14.3 and 14.4 occupies a region of space 18 within which a proximity of an electric-field-influencing media 20 is sensed. The sense 12 and control electrodes 14.1, 14.2, 14.3 and 14.4 are preferably disposed on a common, first surface 22, wherein the control electrodes 14.1, 14.2, 14.3 and 14.4 are disposed outside a periphery 24 of the sense electrode 12. The four control electrodes 14.1, 14.2, 14.3 and 14.4 provide for three-dimensional detection of the proximity relative to the proximity sensor 10, i.e. up-down (x), left-right (y), and in-out (z).

A first oscillatory signal 26 applied to the sense electrode 12 by a signal generator 28 generates the electric field 16. A plurality of second oscillatory signals 30.1, 30.2, 30.3 and 30.4 are applied to respective control electrodes 14.1, 14.2, 14.3 and 14.4 and function as independent control signals to control the geometry of the associated electric field 16. Each second oscillatory signal 30.1, 30.2, 30.3 and 30.4 is coherent with the first oscillatory signal 26, and comprises a plurality of second signal components—control signal components,—each signal component comprising a discrete signal level or signal phase, at a distinct time, so as to control the geometry of the associated electric field 16.

A circuit 32 operatively connected to the sense electrode 12 senses a third signal 34 therefrom, wherein the third signal 34 comprises a plurality of third signal components, each respectively responsive to a respective combination of second signal components applied to the respective control electrodes 14.1, 14.2, 14.3 and 14.4. The third signal 34 is also responsive to the first oscillatory signal 26, and to a proximity of an electric-field-influencing media 20 to the sense electrode 12. The third signal 34 is preferably a current from the sense electrode 12 responsive to applied voltages of the first 26 and second 30.1, 30.2, 30.3 and 30.4 oscillatory signals. Alternately, for first 26 and second 30.1, 30.2, 30.3 and 30.4 oscillatory signals adapted as applied current signals, the associated third signal 34 comprises a voltage on the sense electrode 12. Generally, the third signal 34 either is used to determine the capacitance of the sense electrode 12, or the third signal 34 is a measure of the capacitance of the sense electrode 12.

In accordance with a second aspect of the instant invention, a conductive front driven shield 36—a third electrode,—is located between a first side 38 of the sense electrode 12 and the region of space 18 within which a proximity of an electric-field-influencing media 20 is sensed. The front driven shield 36 is disposed on a second surface 40, proximate to the sense electrode 12, and is insulated from the sense electrode 12, for example by a first insulator 42. The front driven shield 36 and the sense electrode 12 preferably have substantially equal boundaries, so that the front driven shield 36 shadows the sense electrode 12 from the region of space 18. Moreover, the front driven shield 36 is preferably spaced sufficiently close to the sense electrode 12 that the gap therebetween is relatively small compared to the dimension of the sense electrode 12 so as to prevent fringing of the electric field therebetween.

The front driven shield 36 provides for shielding the sense electrode 12 from the effects of electric-field-influencing media 20 in the region of space 18 so that the circuit 32 can measure a parasitic capacitance that would otherwise be attributed to the capacitance of the sense electrode 12 by the circuit 32. This parasitic capacitance, and the associated drift thereof and of circuit gain over time, can be relatively significant in comparison with the magnitude and dynamic range of the capacitance of the sense electrode 12, and if otherwise unaccounted for, would adversely reduce the accuracy of the measurement of the capacitance of the sense electrode 12 by the circuit 32, thereby reducing the accuracy of an associated measurement of the proximity of electric-field-influencing media 20 to the sense electrode 12.

In a shielding mode, the front driven shield 36 is operatively connected to the first oscillatory signal 26 by a switch 44, for example by a field effect transistor switch or by a relay, wherein the same signal, for example an oscillatory voltage, is applied to both the sense electrode 12 and the front driven shield 36 to as to prevent the flow of current therebetween, thereby negating the capacitance of the sense electrode 12 with respect to the region of space 18.

In a sensing mode, the switch 44 is open so as to disconnect the front driven shield 36 from the first oscillatory signal 26, and the front driven shield 36 is either operatively connected to the sense electrode 12 or is electrically floating so as to enable the sense electrode 12 to generate a third signal 34 responsive to the first oscillatory signal 26 and to a proximity to the first side 38 of the sense electrode 12 of an electric-field-influencing media 20 in the region of space 18.

Further in accordance with the second aspect of the instant invention, a conductive rear driven shield 46—a fourth electrode,—is located proximate to a second side 48 of the sense electrode 12. The rear driven shield 46 is disposed on a third surface 50, proximate to the sense electrode 12, and is insulated from the sense electrode 12, for example by a second insulator 52. The second 40 and third 50 surfaces are preferably substantially parallel to the first surface 22. For example, the instant invention can be constructed with a multi-layer printed circuit board, wherein the first surface 22 comprises an inner conductive layer and the second 40 and third 50 surfaces comprise respective outer conductive layers that are separated from the inner conductive layer by first 42 and second 52 insulators comprising the respective circuit board substrates. The rear driven shield 46 is operatively coupled to the first oscillatory signal 26 so as to shield the sense electrode 12 from the influence of an electric-field-influencing media 20 proximate to the second side 48 of the sense electrode 12. The rear driven shield 46 has a boundary that extends up to, and preferably beyond, the boundary of the sense electrode 12. Moreover, the rear driven shield 46 is preferably spaced sufficiently close to the sense electrode 12 that the gap therebetween is relatively small compared to the dimension of the sense electrode 12 so as to prevent fringing of the electric field therebetween. For a remotely located circuit 32, the sense electrode 12, the front driven shield 36, and the rear driven shield 46 are preferably connected to the circuit 32 with a pair of coaxial cables 54, wherein the respective center conductors 56 of the respective coaxial cables 54 are respectively connected to the sense electrode 12 and the front driven shield 36 for communicating respective signals therewith, and the shields 58 of the coaxial cables 54 are each connected to the rear driven shield 46 for sending the first oscillatory signal 26 thereto. The circuit 32 is preferably located proximate to the sense electrode 12—preferably precluding the need for the coaxial cables 54—thereby minimizing the lengths of associated signal conductors so as to thereby minimize the associated parasitic capacitance therefrom.

Figure 4:
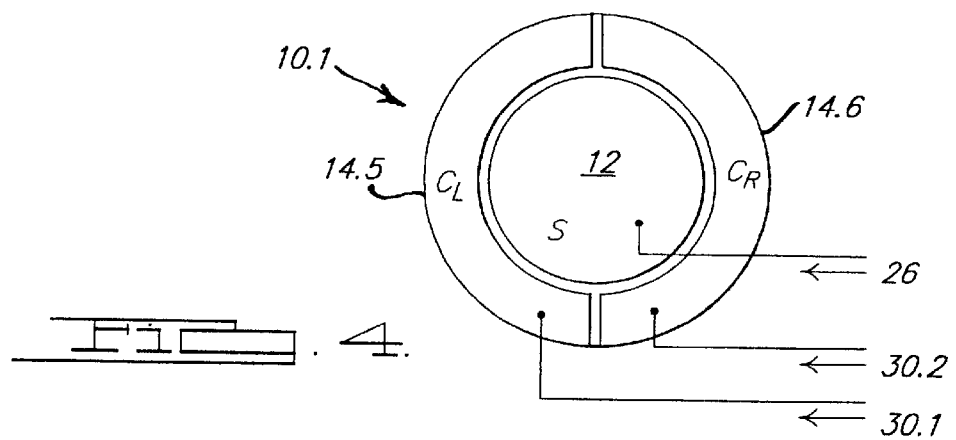
FIG. 4 illustrates a plan view of an electrode assembly in accordance with a second embodiment of the instant invention.

Referring to FIG. 4, an electrode assembly, in accordance with a second embodiment of a first aspect of the instant invention, comprises two control electrodes 14.5, 14.6, that provide for two-dimensional detection of the proximity of an electric-field-influencing media 20 relative to the proximity sensor 10.1, i.e. left-right (y), and in-out (z).

Figures 5A, 5B:
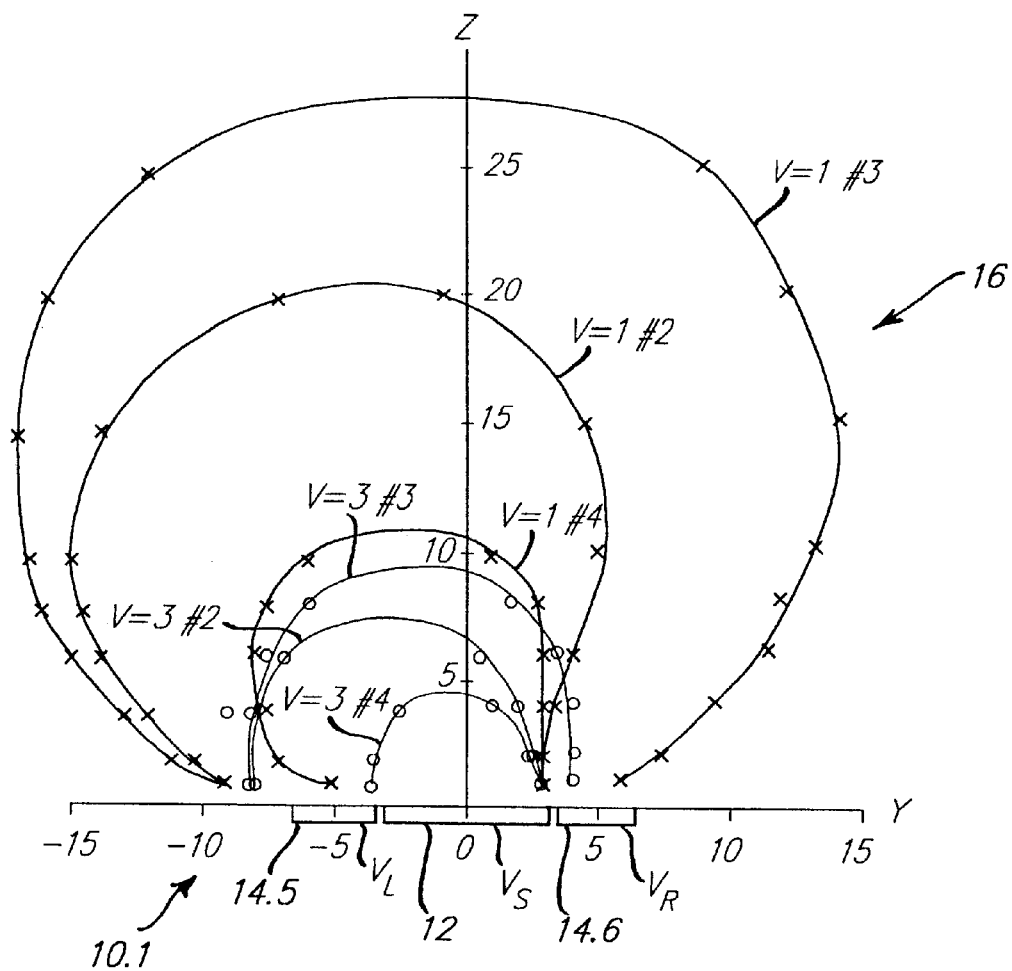
Figure 6A:
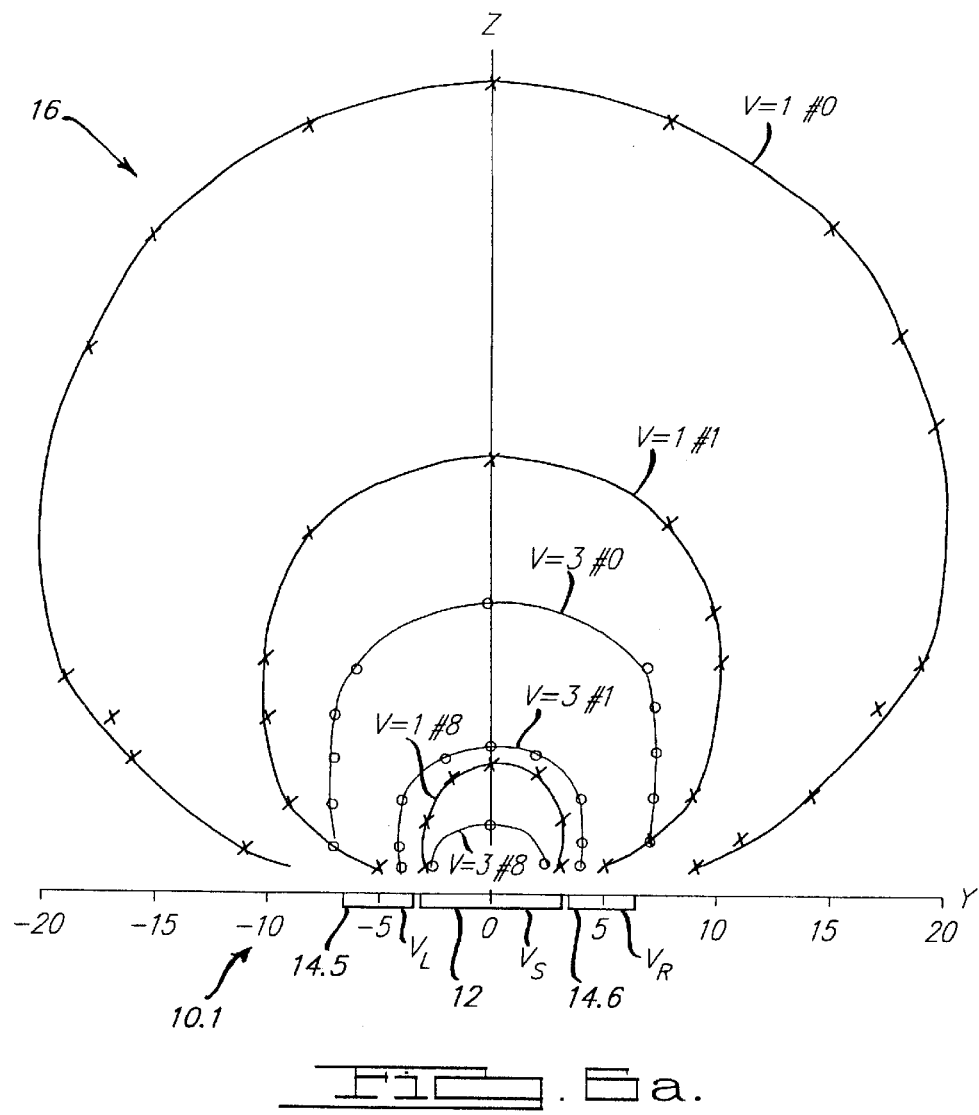
FIG. 6a illustrates a plot of isopotentials for the second embodiment of the instant invention in accordance with the signal levels tabulated in FIG. 6b.
Figure 6B:
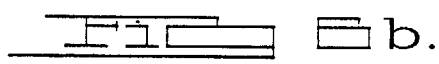

Referring to FIGS. 5a and 6a the 1 volt (V=1) and 3 volt (V=3) isopotential curves for the embodiment of FIG. 4 are plotted in a y-z plane for a first oscillatory signal 26 of 10 volt magnitude, and for the combinations of the second oscillatory signals 30.1, 30.2 tabulated in FIGS. 5b and 6b respectively. FIG. 5a illustrates the effect of asymmetric second oscillatory signals 30.1, 30.2 in shifting the electric field 16 in the lateral, or y, direction, whereas FIG. 6a illustrates the effect of the signal level of the second oscillatory signals 30.1, 30.2 in shifting the electric field 16 in the longitudinal, or z, direction. A conductive electric-field-influencing media 20 increases the capacitance of the sense electrode 12 by about 10 percent when interacting with the 3 volt isopotential, and increases the capacitance of the sense electrode 12 by about 1 percent when interacting with the 1 volt isopotential. The second oscillatory signals 30.1, 30.2 are preferably adapted so the associated second signal components have one of three different values: $+V_{sense}$, 0, and $-V_{sense}$, wherein $V_{sense}$ is the level of the first oscillatory signal 26, thereby simplifying the associated circuitry for generating the second oscillatory signals 30.1, 30.2. The number of different electric field configurations that be generated in a proximity sensor 10 with N control electrodes and M second oscillatory signal levels is given by $M^N$. Accordingly, for the proximity sensor 10.1 of FIG. 4 with two control electrodes, the number of different electric field configurations is $3^2=9$, whereas for the proximity sensor 10 of FIG. 1 with four control electrodes, the number of different electric field configurations is $3^4=81$. Asymmetric potentials of the control electrodes 14.5, 14.6 provide for associated asymmetric sensitivities of the associated electric field configurations. Each distinct electric field configuration generally provides an associated distinct associated component of the third signal 34 for a given proximity of a given electric-field-influencing media 20, so that the proximity of a given electric-field-influencing media 20 can be determined from the combination of measurements of the third signal 34 responsive to each of the electric field configurations.

For example, if a relatively positive sense electrode 12 is surrounded by relatively negative control electrodes 14.5, 14.6, then the electric field flux density is greatest between the sense 12 and control electrodes 14.5, 14.6, resulting in a relatively short range sensitivity pattern. Conversely, if the control electrodes 14.5, 14.6 are at the same potential as the sense electrode 12, then there is no inter-electrode electric field, and all of the electric field originating from the sense 12 and control electrodes 14.5, 14.6 terminates in the ground of the surroundings of the proximity sensor 10.1, thereby providing for a relatively long range sensitivity pattern.

Referring to FIG. 7, illustrating a first embodiment of circuit 32 in accordance with the instant invention, a signal generator 28, preferably a sinusoidal oscillator, for example operating at about 100 KHz, is operatively coupled through a reference capacitor CR so as to form a first oscillatory signal 26 comprising a sinusoidal voltage signal having a voltage level of $V_{sense}$. The first oscillatory signal 26 is operatively connected to the sense electrode 12 and an input of an associated detector circuit 60; and is operatively connected through a buffer 62 ($B_1$), for example a voltage follower, to the following elements:

1. the rear driven shield 46;
2. a buffer 62 ($B_{FDS}$) through a relay 66 ($R_{FDS}$) to the front driven shield 36;
3a. a buffer 62 ($B_L$) through a relay 66 ($R_L^+$) to the left control electrode 14.5;
3b. a unity gain inverting amplifier 68 ($A_L$) through a relay 66 ($R_L^-$) to the left control electrode 14.5;
4a. a buffer 62 ($B_R$) through a relay 66 ($R_R^+$) to the right control electrode 14.6; and
4b. a unity gain inverting amplifier 68 ($A_R$) through a relay 66 ($R_R^-$) to the right control electrode 14.6.

The left 14.5 and right 14.6 control electrodes are also connected to ground through respective relays 66 ($R_L$ and $R_R^0$).

In operation, both the sense electrode 12 and the rear driven shield 46 have a potential of $V_{sense}$, so that an electric-field-influencing media 20 behind the sense electrode 12 does not affect the capacitance of the sense electrode 12 relative to the ground 70 of the system in which proximity sensor 10.1 is located, and therefore does not influence the current (34) of the voltage signal (26) applied to the sense electrode 12. Accordingly, the proximity sensor 10.1 is not responsive to the proximity of an electric-field-influencing media 20 behind the rear driven shield 46.

In a shielding mode, when the first oscillatory signal 26 is operatively connected to the front driven shield 36 through the associated relay 66 ($R_{FDS}$) by the activation thereof, an electric-field-influencing media 20 in the region of space 18 in front of the sense electrode 12 does not affect the capacitance of the sense electrode 12 relative to the ground 70 of the proximity sensor 10.1, and therefore does not influence the current (34) of the voltage signal (26) applied to the sense electrode 12. Accordingly, in the shielding mode, the detector circuit 60 is only responsive to the capacitance that is inherent in the circuit, not including the sense electrode 12. The proximity sensor 10.1 is calibrated by activating the $R_{FDS}$ signal, thereby activating the associated relay 66, and measuring the associated capacitance $C_{offset}$. Then, a temperature stable calibration capacitor $C_{cal}$ is switched in parallel with the sense electrode 12 by an associated relay 66 ($R_{CAL}$), thereby adding a known amount of capacitance to the circuit 32, so that the calibration factor comprising a capacitance/current ratio (or capacitance/voltage) can be determined.

In a sensing mode, the $R_{FDS}$ signal is inactive, whereby the front driven shield 36 becomes electrically floating, and the sense electrode 12 becomes responsive to an an electric-field-influencing media 20 in the region of space 18 in front of the sense electrode 12. An electric-field-influencing media 20 proximate to the sense electrode 12 changes the capacitance of the sense electrode 12, which affects the current (34) of the voltage signal (26) applied to the sense electrode 12. The detector circuit 60 then converts the measured current (34) to a measure of capacitance using the above determined calibration factor.

The geometry of the electric field 16 from the sense electrode 12 for a given first oscillatory signal 26 applied thereto is responsive to the second oscillatory signals 30.1 and 30.2 respectively applied to the left 14.5 and right 14.6 control electrodes. The circuit 32 illustrated in FIG. 7 provides a means for applying one of three different potentials to each of the control electrodes 14.5, 14.6, thereby providing $3^2=9$ different combinations of control potentials and an associated nine different electric field geometries. The response of the third signal 34 to the proximity of an electric-field-influencing media 20 at a given location is different for different electric field geometries. Conversely, by measuring the third signal 34 for each electric field geometry, the proximity sensor 10.1 is able to determine presence and location of an electric-field-influencing media 20 proximate thereto.

More particularly, a potential of $+V_{sense}$ is generated from the first oscillatory signal 26 through a buffer 62 ($B_L$) and is applied to the left control electrode 14.5 by activating relay 66 ($R_L^+$); a ground potential is applied to the left control electrode 14.5 by activating relay 66 ($R_L^0$); and a potential of $-V_{sense}$ is generated from the first oscillatory signal 26 through an inverting amplifier 68 ($A_L$) and is applied to the left control electrode 14.5 by activating relay 66 ($R_L^-$), wherein the activations of the respective relays 66 ($R_L^+$, $R_L^0$, and $R_L^-$) are mutually exclusive.

Similarly, a potential of $+V_{sense}$ is generated from the first oscillatory signal 26 through a buffer 62 ($B_R$) and is applied to the right control electrode 14.6 by activating relay 66 ($R_R^+$); a ground potential is applied to the right control electrode 14.6 by activating relay 66 ($R_R^0$); and a potential of $-V_{sense}$ is generated from the first oscillatory signal 26 through an inverting amplifier 68 ($A_R$) and is applied to the right control electrode 14.6 by activating relay 66 ($R_R^-$), wherein the activations of the respective relays 66 ($R_R^+$, $R_R^0$, and $R_R^-$) are mutually exclusive.

Whereas FIG. 7 illustrates the use of a relay 66 as a switching element, one of ordinary skill in the art will recognize that other types of switching elements, for example a field effect transistor, can be substituted for any of the relays 66 in the circuit 32.

Referring to FIG. 8a sense electrode 12 of a proximity sensor 10 is driven with a continuous wave 100 KHz sinusoidal first oscillatory signal 26 from a signal generator 28 through a front-end amplifier 72. A "buffered" version of the first oscillatory signal 26 is used to drive the control electrode driver 74—for example as illustrated in greater detail in FIG. 7—which in turn drives the control electrodes 14 with associated second oscillatory signals 30. The second oscillatory signals 30 can be either in-phase or out-of-phase with the first oscillatory signal 26, preferably responsive to digital control.

The front-end amplifier 72 is operatively connected to the sense electrode 12 and to the signal generator 28, and outputs to a detector circuit 60 a 100 KHz sinusoidal signal, the amplitude of which increases as either the capacitance of the sense electrode or the parasitic capacitance associated therewith increases. The front-end amplifier 74 incorporates a circuit for partially canceling the effects of offset capacitances, which allows a higher gain in the front-end without saturation from offset capacitances. The front-end amplifier 74 also incorporates two capacitors that can be digitally switched in parallel with the sensor; the first used as a reference, or calibration, capacitor; the second used to modify the range of capacitance values for different combinations of the second oscillatory signals 30 so that the capacitance of the sense electrode 12 can be measured for the range of second oscillatory signals 30 with a common gain setting.

A high pass filter 76 operatively connected to the output of the front-end amplifier 72 filters out base band (especially 60 Hz) signals before detection. This is necessary because the detector is essentially a peak detector and cannot otherwise distinguish the envelope of the 100 KHz signal from additive signals at the base band.

A detector 78, comprising a simple diode detector, detects the filtered signal from the high pass filter 76. The diode detector is the dominant non-linear element of the circuit 32.

The output from the detector 78 is filtered by a 2-pole low pass filter 80 (LPF) having a 1 KHz cutoff frequency, the DC offset of which is removed by an adjustable amount by a DC offset removal circuit 82, so as to enable allow DC amplification by an amplifier 84. The amplifier 84 comprises two stages, each of which incorporates a single pole filter having a 500 Hz cutoff frequency, each stage having a different gain, for example a low gain stage having a gain of 4, and a high gain stage having a gain of 20, wherein signals from each of the amplifier stages are output so as to provide respective measures of the capacitance of the sense electrode 12 and associated parasitic capacitance elements.

Referring to FIG. 9 the front-end amplifier 72, excluding the associated calibration capacitor circuitry, comprises an amplifier 86 ($U_1$) and an offset canceling circuit 88 ($U_2$).

The amplifier 86 ($U_1$), for example an operational amplifier (op-amp), operates as a current to voltage converter. The non-inverting input is driven with the first oscillatory signal 26. In accordance with a first property of the associated op-amp ($U_1$), the voltage at the inverting input is the same as that at the non-inverting input. The signal at the inverting input drives the sensor electrode 12, thereby generating the third signal 34, the AC current in the signal to and from the sensor. In accordance with a second property of the associated op-amp ($U_1$), wherein the current into the inverting and non-inverting inputs is substantially zero, the current in the signal to and from the sensor flows through the feedback resistor so as to generate an associated output voltage $V_{out}$ responsive thereto.

The amplifier 86 ($U_1$) can also be understood as a non-inverting amplifier with a transfer function of:

$$V\text{out} = V + (1 + j\omega RC)$$

The front-end amplifier 72 has the following properties:
1. If there is no capacitance then the output is the same as the drive signal on the non-inverting input (i.e. it is a voltage follower).
2. As the capacitance of the sensor increases, the output voltage increases and also starts to go out of phase with the drive voltage.
3. The change in output voltage is linearly related to the frequency of the drive signal, the size of the feedback resistor Rfb, the magnitude of the drive voltage, and the change in the capacitance.
4. If there is a large offset capacitance, then the gain must be low or the output voltage will be saturated. Accordingly, an offset canceling circuit is incorporated to prevent this problem.
5. The circuit is less effective above about 100 KHz because the op-amps begin to become non-ideal. The feedback current is preferably such that the inverting input is kept at the same voltage as the non-inverting input.

The front-end amplifier 72 preferably incorporates the following design considerations:
1. The frequency of the drive signal should be set as high as possible such that the op-amp performance remains reasonably ideal. For example, 100 KHz is a good compromise.
2. The size of the drive signal should be as large as possible such that the output voltage does saturate as the measured capacitance increases, thereby providing for increased signal-to-noise ratio. Both noise currents and signal currents are amplified, so it is advantageous to make the signal currents as large as possible.
3. The feedback resistor can be set to provide the desired sensitivity. The change in output voltage due a change in capacitance is:

$$\Delta V_{out}(dc) = \alpha \times \omega \times R_{fb} \times V_{drive}(\text{peak}) \times \text{Gain}(dc) \times \Delta \text{Capacitance}$$

where $\alpha$ is dependent on the circuit capacitance but is usually 0.7–0.9. For example, if it is desired to have a 40 mV output change for a 0.01 pf change in capacitance then for $\alpha = 0.8$; $\omega = 6.28 \times 10^5$; $V_{drive}(\text{peak}) = 1V$; Gain($dc$) = 20; $\Delta$Capacitance = $10^{-14}$ $R_{fb} = 0.04/(0.8 \times 6.28 \times 10^5 \times 1 \times 20 \times 10^{-14}) = 398$ KΩ

The remainder of the circuit is used to adjust the current into and out of the inverting input node. A large offset capacitance can cause a large offset current which can saturate the output voltage at the desired gain level. These offset capacitances $C_{offset}$ originate with the circuit, the wire to the sensor, or the back side of the sensor. Amplifier $U_2$ in the offset canceling circuit 88 is designed to generate a signal that is in-phase with the sensor drive signal (inverting input of $U_1$), having an output that is larger than the sensor drive signal so as to inject a current that cancels some of the offset current in the signal to the sense electrode 12 that results from the associated offset capacitances $C_{offset}$. Amplifiers $U_3$ and $U_4$ provide for adjusting the amplitudes of the drive signals to amplifiers $U_2$ and to $U_1$ without altering the phase thereof.

The circuit 32 is preferably adapted to provide a measure of capacitance with an output voltage that is roughly linear with the capacitance of the sense electrode 12. However, various associated gain factors are subject to drift.

Figure 10A:
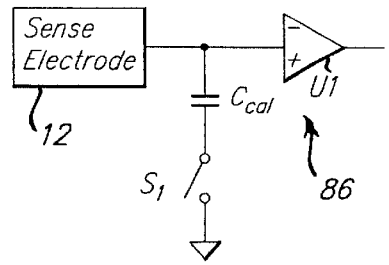
FIG. 10a illustrates a first embodiment of a circuit for switching a calibration capacitor.
Figure 10B:
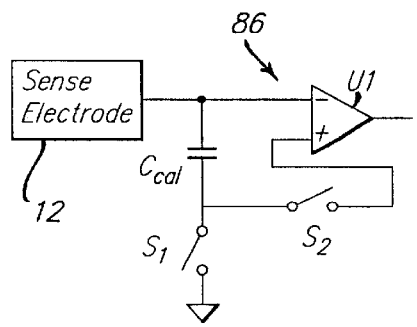
FIG. 10b illustrates a second embodiment of a circuit for switching a calibration capacitor.

Referring to FIGS. 10a and 10b (and as illustrated in FIG. 7), to compensate for this drift, the circuit 32 is provided with a switchable calibration capacitor $C_{cal}$ which enables the associated gain factors to be measured over time during the operation of the proximity sensor 10.

Accurately switching in and out a very small (1 pf or less) calibration capacitance can be difficult. One side of the calibration capacitor $C_{cal}$ is operatively connected to the sense electrode 12 and to the inverting input of an amplifier 86 ($U_1$). As illustrated in FIGS. 7, 10a and 10b, the other side of the calibration capacitor $C_{cal}$ is switched to ground by a first switch $S_1$, so that when first switch $S_1$ is closed, the capacitance of calibration capacitor $C_{cal}$ is added to that of the sense electrode 12. However, one problem with this arrangement of FIGS. 7 and 10a is that when the first switch $S_1$ is opened, the capacitance of the first switch $S_1$ is typically larger than the capacitance $C_{cal}$ of the calibration capacitor $C_{cal}$, thereby defeating the purpose of the calibration capacitor $C_{cal}$. For example, a typical FET may have an OFF capacitance of 40 pf, so if the capacitance $C_{cal}$ is 1 pf, then the series combination is 0.98 pf, which means that effectively the calibration capacitor $C_{cal}$ is never switched out of the circuit.

This problem is overcome by the arrangement of FIG. 10b, wherein the other side of the calibration capacitor $C_{cal}$ is switched to the non-inverting input of the amplifier 86 ($U_1$) by a second switch $S_2$ When the first switch So, is closed and the second switch $S_2$ is open, one side of the calibration capacitor $C_{cal}$ is pulled to ground, thereby switching the calibration capacitor $C_{cal}$ into the circuit. When the first switch $S_1$ i opened and the second switch $S_2$ is closed, both sides of the calibration capacitor $C_{cal}$ are driven by the same signal, preventing any current from flowing through the calibration capacitor $C_{cal}$ thereby effectively switching the calibration capacitor $C_{cal}$ out of the circuit.

Figure 11:
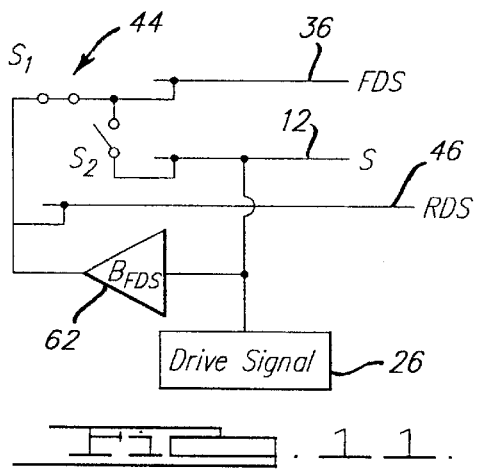
FIG. 11 illustrates a front driven shield in a shielding mode in accordance with a second aspect of the instant invention.
Figure 12:
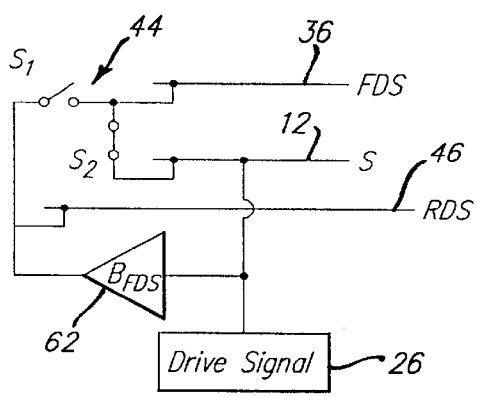
FIG. 12 illustrates a front driven shield in a sensing mode in accordance with a first embodiment of a second aspect of the instant invention.
Figure 13:
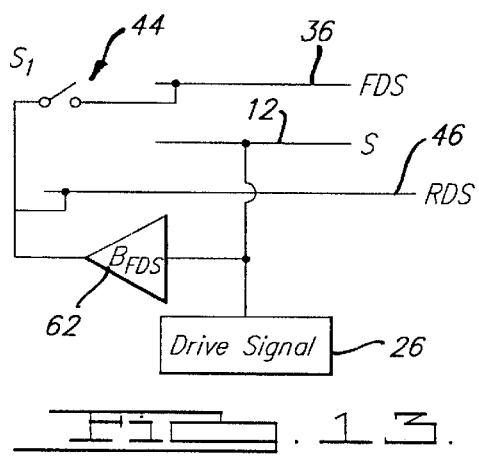
FIG. 13 illustrates a front driven shield in a sensing mode in accordance with a second embodiment of a second aspect of the instant invention.

Referring to FIGS. 11–13, in accordance with the second aspect of the instant invention, in a shielding mode, the front driven shield 36 is switched by a first switch 44 ($S_1$) to a buffered version of the first oscillatory signal 26 so as to electrostatically shield the sense electrode 12. In a sensing mode, the first switch 44 ($S_1$) is opened, thereby disconnecting the front driven shield 36 from the first oscillatory signal 26, and the front driven shield 36 either is operatively connected to the sense electrode 12 by closing a second switch 90 ($S_2$) therebetween, as illustrated in FIG. 12; or is electrically floating, as illustrated in FIG. 13.

Figure 14:
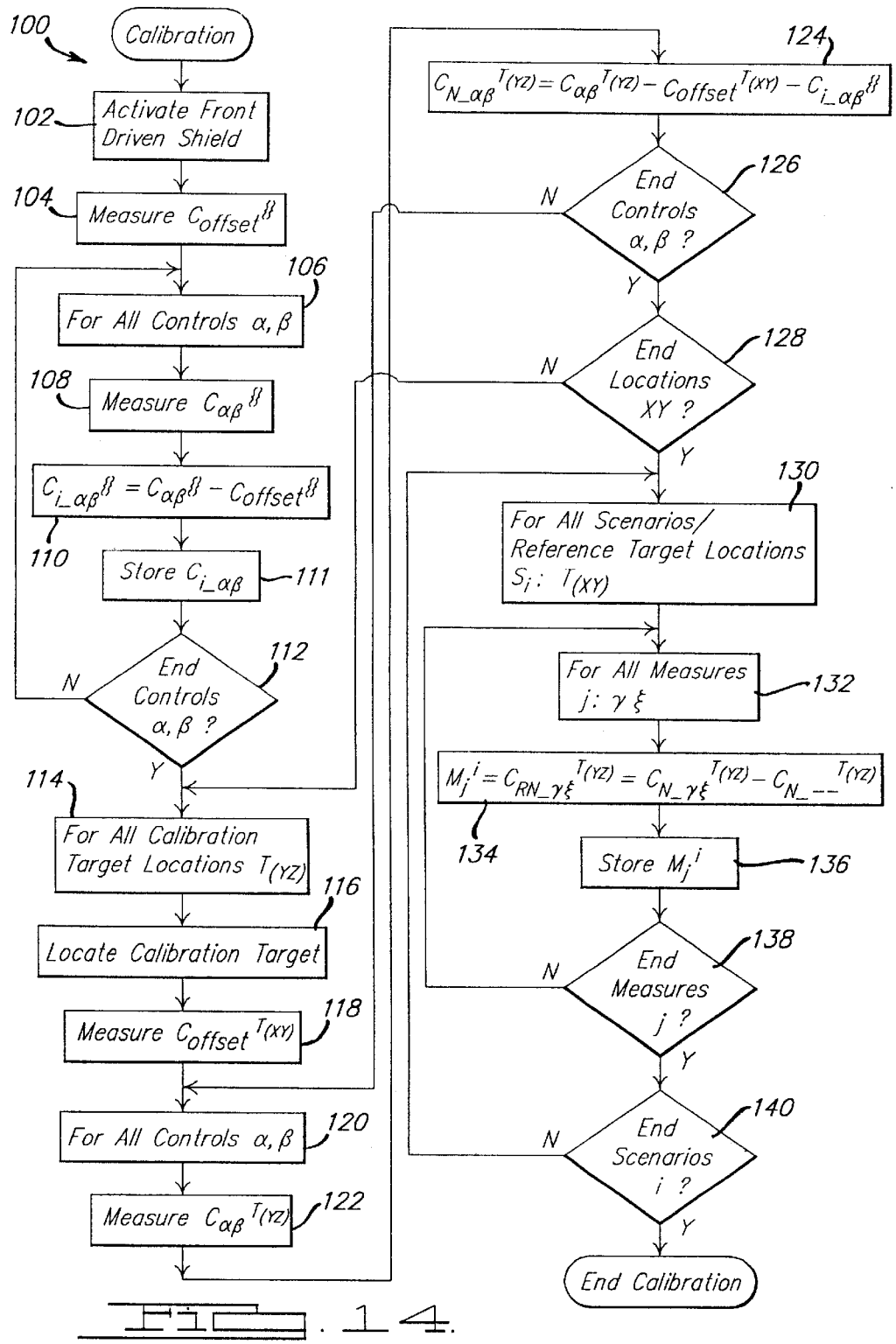
FIG. 14 illustrates a flow chart of a calibration process in accordance with the instant invention.

The proximity sensor 10 is calibrated to detect specific proximity scenarios in accordance with a calibration process (100) illustrated in FIG. 14. The proximity sensor 10 is placed in the expected operating environment, without any detectable objects present. For example, for a proximity sensor 10 used to sense the proximity of objects to a safety restraint system, during the calibration process, the proximity sensor 10 is placed in a known environment simulating the car interior, wherein the background is held constant throughout the process.

In step (102), the circuit 32 activates the front driven shield 36, and in step (104) measures the offset capacitance $C_{offset}^{\{\}}$ from the output of the detector circuit 60, wherein the superscript $^{\{\}}$ represents the condition of no objects present. For a proximity sensor 10.1 with two control electrodes 14.5, 14.6, nine different combinations of control signal components as follows:

| Control Signal Component | α | β |
|---|---|---|
| 0 | + | + |
| 1 | 0 | 0 |
| 2 | + | − |
| 3 | + | 0 |
| 4 | 0 | − |
| 5 | − | + |
| 6 | 0 | + |
| 7 | − | 0 |
| 8 | − | − | wherein α and β represent the respective voltages applied to the left 14.5 and right 14.6 control electrodes, with + representing a voltage of $+V_{sense}$, 0 representing a ground potential, and − representing a voltage of $-V_{sense}$.

Beginning with step (106), for all control conditions α and β, with the front driven shield 36 inactive, the corresponding capacitance $C_{\alpha\beta}^{\{\}}$ of the sense electrode 12 is measured in step (108), and is adjusted for $C_{offset}^{\{\}}$ in step (110) by calculating $C_{i\_\alpha\beta}^{\{\}}$ as follows:

$$C_{i\_\alpha\beta}^{\{\}} = C_{\alpha\beta}^{\{\}} - C_{offset}^{\{\}}$$

In step (111) the value $C_{i\alpha\beta}^{\{\}}$ is stored for later use. In step (112), the process beginning with step (106) is repeated for all control conditions α and β.

Figure 15:
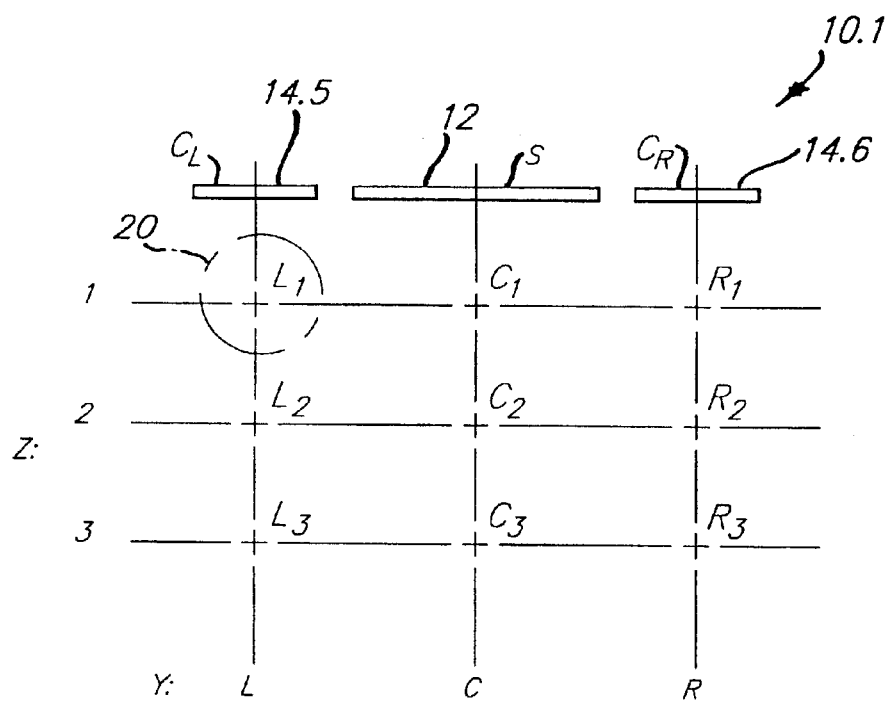
FIG. 15 illustrates a set of calibration target locations in accordance with the calibration process of FIG. 14.

Referring to FIG. 15, the calibration process (100) continues by placing a calibration target 92 at a plurality of positions, wherein each position corresponds to a particular detectable proximity scenario, i.e. object presence and location. As described hereinbelow, in operation, the proximity sensor 10 provides a measure of 1) whether a detectable object is present in proximity to the proximity sensor 10, and if so, 2) the particular proximity scenario that most likely represents the position of the detectable object, wherein the detectable object comprises an electric-field-influencing media 20. The proximity sensor 10.1 with two control electrodes 14.5, 14.6 provides for principally sensing with two degrees of freedom in the y-z space illustrated in FIG. 15. The calibration target 92 is preferably a grounded conductive object, for example a copper coated flask, that is electrostatically representative of objects that are to be sensed by the proximity sensor 10.1. The calibration target locations include, for example, all combinations of three lateral (y: L, C, R) coordinates and three longitudinal (z: 1, 2, 3) coordinates, as follows:

| Calibration Target Location | |
|---|---|
| y | z |
| {} | {} |
| L | 1 |
| C | 1 |
| R | 1 |
| L | 2 |
| C | 2 |
| R | 2 |
| L | 3 |
| C | 3 |
| R | 3 |

Beginning with step (114), for all calibration target locations (y, z) of the calibration target 92, the calibration target 92 is located at location (y, z) in step (116) and the offset capacitance $C_{offset}^{T(yz)}$ is measured in step (118). With the calibration target 92 at a fixed location, then beginning with step (120), for all control conditions α and β, for each control condition α, β the capacitance $C_{\alpha\beta}^{T(yz)}$ of the sense electrode 12 is measured in step (122), and is normalized in step (124) by calculating $C_{N\_\alpha\beta}^{T(yz)}$ as follows:

$$C_{N\_\alpha\beta}^{T(yz)} = C_{\alpha\beta}^{(yz)} - C_{offset}^{T(yz)} - C_{i\_\alpha\beta}^{\{\}}$$

In step (126), the process beginning with step (120) is repeated for all control conditions α and β, and in step (128) the process beginning with step (114) is repeated for all calibration target locations (y, z).

Figure 16:
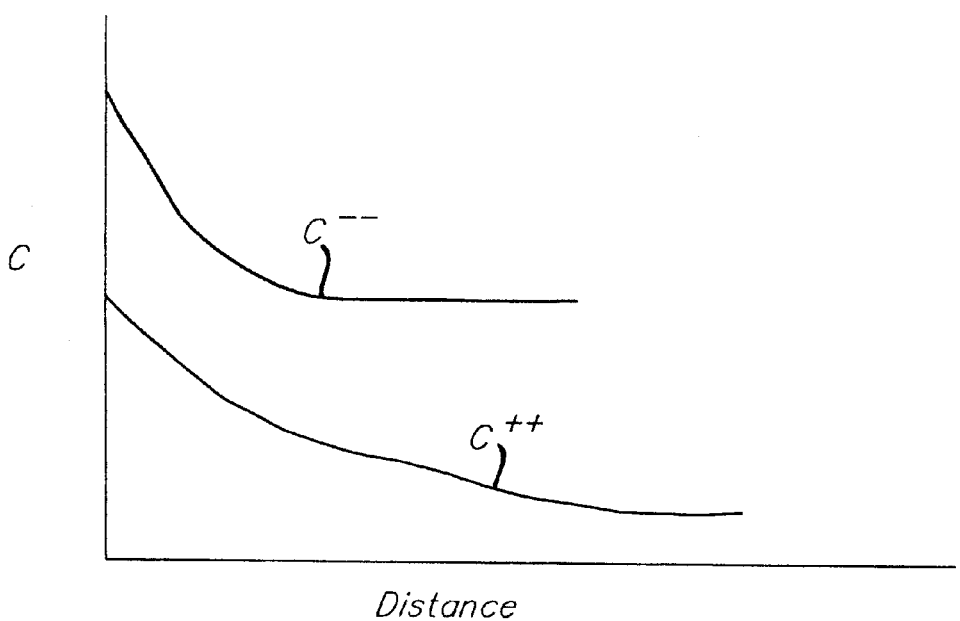
FIG. 16 illustrates sensor measurements for two different control modes of the instant invention.
Figure 17:
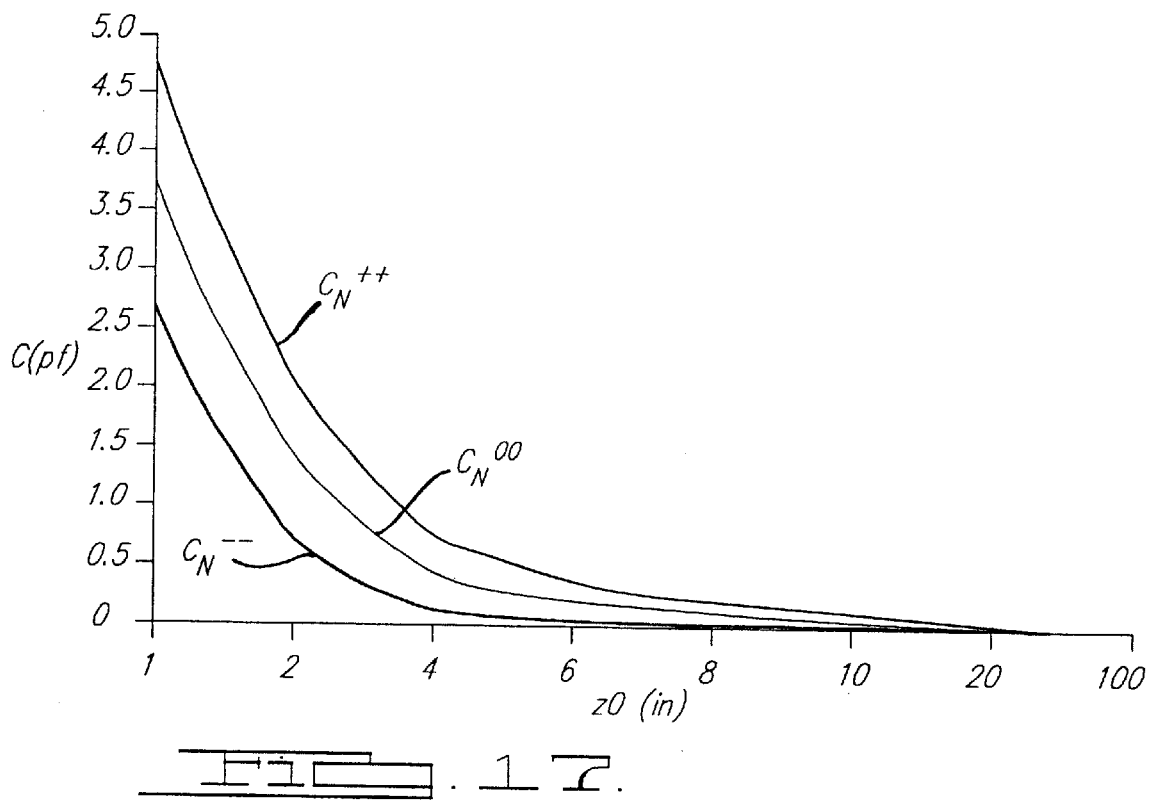
FIG. 17 illustrates normalized sensor measurements for three different control modes of the instant invention.

The normalized capacitance values, $C_{N\_\alpha\beta}^{T(yz)}$, provide a measure of the change in capacitance of the sensor electrode 12 responsive to the calibration target 92. The effect of the normalization process is illustrated by FIGS. 16 and 17, wherein the normalized capacitance values $C_{N\_\alpha\beta}^{\{\}}$ for all control signal components are substantially zero when no target is present, and the for the (++) control signal configuration that provides a longer range electric field 16, the associated capacitance value $C_{N\_++}{}^{T(yz)}$ is greater than the capacitance value $C_{N\_--}{}^{T(yz)}$ for the (--) control signal configuration that provides a shorter range electric field 16.

A proximity scenario space $\{S_i\}$ is divided into ten categories corresponding to a) the no-target condition, and b) the nine distinct calibration target locations, as follows:

| Scenario | | y | z |
|---|---|---|---|
| $S_0$ | No Target | {} | {} |
| $S_1$ | Left Close (L1) | L | 1 |
| $S_2$ | Left Middle (L2) | C | 1 |
| $S_3$ | Left Far (L3) | R | 1 |
| $S_4$ | Center Close (C1) | L | 2 |
| $S_5$ | Center Middle (C2) | C | 2 |
| $S_6$ | Center Far (C3) | R | 2 |
| $S_7$ | Right Close (R1) | L | 3 |
| $S_8$ | Right Middle (R2) | C | 3 |
| $S_9$ | Right Far (R3) | R | 3 |

In general, the scenario categories are in one-to-one relationship with the associated calibration target locations, and represent the locations to which an unknown target is assigned by an associated measurement process. In other words, the resolution of the proximity sensor 10.1 is dependent upon the corresponding resolution of the associated calibration target locations and associated scenarios.

A plurality of reference normalized signal components, and associated measures, are defined in the following process as a function of the normalized capacitance values $C_{N\_\alpha\beta}{}^{T(yz)}$, wherein the number of the plurality of measures is one less than the number of the plurality of normalized capacitance values. For a proximity sensor 10.1 with two control electrodes 14.5, 14.6, eight different combinations of reference normalized signal components, $\gamma$, $\xi$, are given as follows:

| Reference Normalized Signal Component | $\gamma$ | $\xi$ |
|---|---|---|
| 0 | + | + |
| 1 | 0 | 0 |
| 2 | + | − |
| 3 | + | 0 |
| 4 | 0 | − |
| 5 | − | + |
| 6 | 0 | + |
| 7 | − | 0 |

Figure 18:
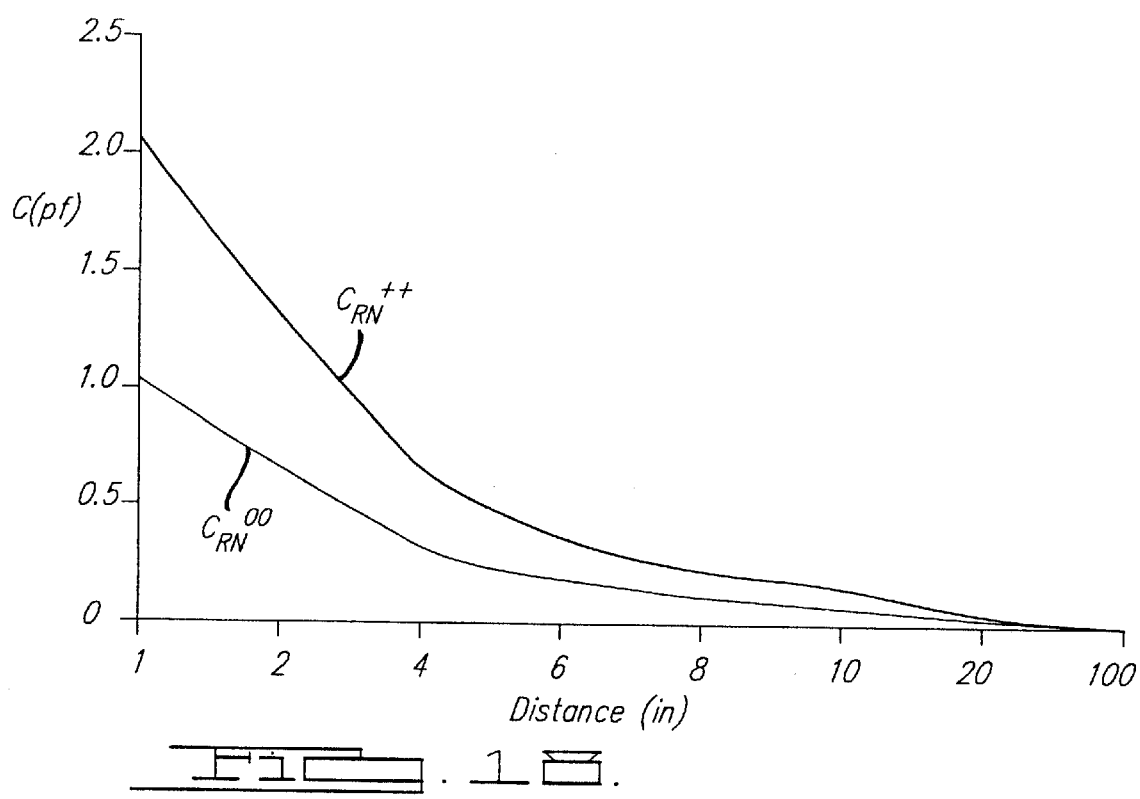
FIG. 18 illustrates measures associated with the sensor measurements of FIG. 17.

Beginning with step (130), for all scenarios (i), then beginning with step (132), for all measures (j), for each reference normalized signal component $\gamma$, $\xi$ the reference normalized capacitance $C_{RN\_\gamma\xi}{}^{T(yz)}$ is calculated in step (134) as follows:

$$M_j^i = C_{RN\_\gamma\xi}{}^{T(yz)} = C_{N\_\gamma\xi}{}^{T(yz)} - C_{N\_--}{}^{T(yz)}$$

wherein $M_j^i$ is the calibration value of the $j^{th}$ measure for the $i^{th}$ scenario. The process of subtracting $C_{N\_--}{}^{T(yz)}$ from the other normalized capacitance values to form the associated reference normalized capacitance values removes remaining offsets in the normalized capacitance values and tends to linearize the relationship between capacitance and distance in the resulting measure. Because $C_{N\_--}{}^{T(yz)}$ is substantially zero for distant objects, this subtraction does not substantially reduce the normalized capacitance values for distant objects. FIG. 18 illustrates the reference normalized signal components corresponding to the normalized signal components of FIG. 17.

Accordingly, for a proximity sensor 10.1 with two control electrodes 14.5, 14.6, the corresponding eight different measures $M_j$ are given as follows:

| Measure j | |
|---|---|
| $M_0$ | $C_{RN\_++}{}^{T(yz)}$ |
| $M_1$ | $C_{RN\_00}{}^{T(yz)}$ |
| $M_2$ | $C_{RN\_+-}{}^{T(yz)}$ |
| $M_3$ | $C_{RN\_+0}{}^{T(yz)}$ |
| $M_4$ | $C_{RN\_0-}{}^{T(yz)}$ |
| $M_5$ | $C_{RN\_-+}{}^{T(yz)}$ |
| $M_6$ | $C_{RN\_0+}{}^{T(yz)}$ |
| $M_7$ | $C_{RN\_-0}{}^{T(yz)}$ |

Each reference measure $M_j^i$ is stored in step (136) for later use during the associated measurement process.

In step (138), the process beginning with step (132) is repeated for all measures (j), and in step (140) the process beginning with step (130) is repeated for all scenarios (i), after which the calibration process (100) is terminated.

The principal outcome of the calibration process (100) is the measurement, calculation and storage of both the initial no-target capacitance values $C_{i\_\alpha\beta}{}^{\{\ \}}$ and the reference measures $M_j^i$. Each reference measure $M_j^i$ is the expected value of measure $M_j$ when the proximity sensor 10.1 is used to measure the calibration target 92 located at a position corresponding to the $i^{th}$ scenario.

Figure 19:
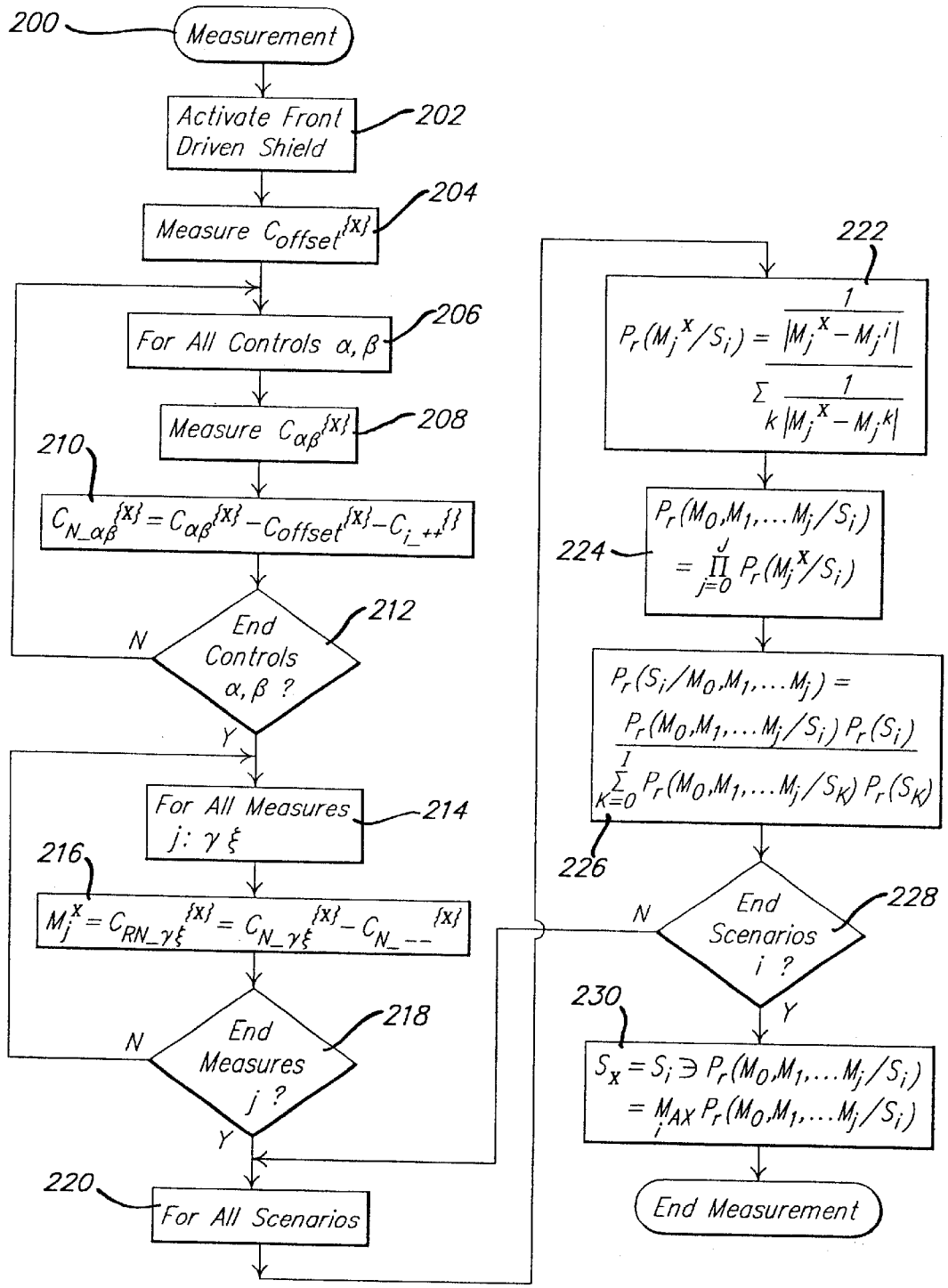
FIG. 19 illustrates a flow chart of a measurement process in accordance with the instant invention.

The proximity sensor 10.1 measures the proximity of an unknown target, or electric-field-influencing media 20, in accordance with a measurement process (200) illustrated in FIG. 19.

Given the above eight measures $M_j$ and the above ten scenarios $S_i$, the probability of the occurrence of a scenario $S_i$ for a given set of values for the eight measures, i.e. $M_k$; $k=0,\ldots,7$, can be calculated as follows using Bayes rule:

$$\Pr(S_i \mid M_0, M_1, M_2, M_3, M_4, M_5, M_6, M_7) = \frac{\Pr(M_0, M_1, M_2, M_3, M_4, M_5, M_6, M_7 \mid S_i)\Pr(S_i)}{\sum_{k=0}^{9} \Pr(M_0, M_1, M_2, M_3, M_4, M_5, M_6, M_7 \mid S_k)\Pr(S_k)}$$

wherein the scenarios $S_i$ are assumed to be mutually exclusive, as they are because the target position is unique for each scenario.

Each of the scenarios is assigned an a priori probability Pr(Si) representing the probability of occurrence of that scenario. Typically, each scenario is assumed to be equally likely, so that for 10 different scenarios, the a priori probability of each scenario is equal to 0.1. Ideally, the a priori probabilities would be assigned values corresponding to the percentage of time each particular scenario actually occurs for a large number of experiments representing an entire range of seat occupancy conditions as they would occur during the normal use of the vehicle by a normal group of vehicle occupant situations. Alternately, different scenarios could be weighted differently so as to increase the likelihood of correctly identifying the most important scenarios, e.g. those scenarios for which a restraint system should be disabled so as to prevent injury to out-of-position occupants.

The individual measures, $M_j$, are derived from respective measurements of the capacitance of the sensor electrode 12 for corresponding levels of the second oscillatory signals 30.1, 30.2 applied to the control electrodes 14.5, 14.6, for a given first oscillatory signal 26 applied to the sensor electrode 12. Whereas the individual measures $M_j$ are derived from independent sensor measurements, the values of the measures $M_j$ for a given scenario $S_i$ are generally interrelated to at least some extent through the geometry of the sense 12 and control electrodes 14.5, 14.6 in relation to the object being sensed, and the nature of the electric field 16 therebetween.

Individual probability functions are defined for each of the eight measures for each of the ten scenarios, i.e. $P(M_j S_i)$, resulting in a total of 80 distributions. For example, one quasi-independent probability function is given by:

$$\Pr(M_j | S_i) = \frac{\frac{1}{|M_j - M_j^i|}}{\sum_k \frac{1}{|M_j - M_j^k|}}$$

where $M_j$ is the value of the measure based upon the measurement of the proximity sensor 10.1, and $M_j^k$ is value of the measure for the calibration target 92 in the position associated with scenario $S_k$ for the second oscillatory signals 30.1, 30.2 to the control electrodes 14.5, 14.6 in accordance with measure $M_j$. Accordingly, this probability function is the reciprocal of the difference between the measured capacitance and the expected capacitance for a target at a given position, normalized so that the sum of the probabilities for all allowed scenarios $S_i$ is unity.

In step (202), the circuit 32 activates the front driven shield 36, and in step (204) measures the offset capacitance $C_{offset}^{\{X\}}$ from the output of the detector circuit 60, wherein the superscript $^{\{X\}}$ represents an unknown target (or no target) at an unknown position relative to the proximity sensor 10.1.

Beginning with step (206), for all control conditions $\alpha$ and $\beta$, with the front driven shield 36 inactive, the corresponding capacitance $C_{\alpha\beta}^{\{X\}}$ of the sense electrode 12 is measured in step (208), and is normalized in step (210) by calculating $C_{N\_\alpha\beta}^{\{X\}}$ as follows:

$$C_{N\_\alpha\beta}^{\{X\}} = C_{\alpha\beta}^{\{X\}} - C_{offset}^{\{X\}} - C_{i\_++}^{\{X\}}$$

Figure 20:
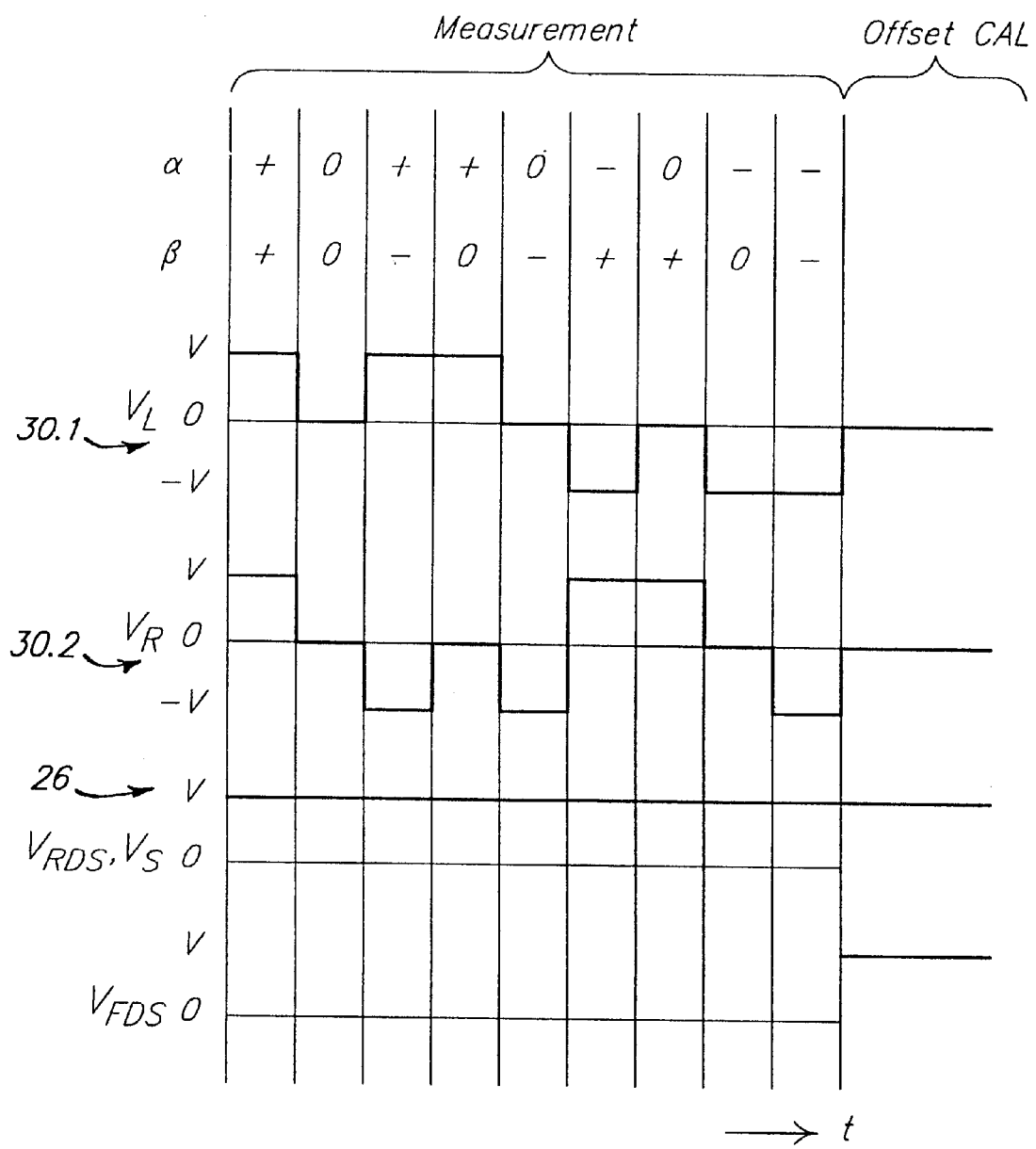
FIG. 20 illustrates time series of various signals in accordance with the calibration and measurement processes of FIGS. 14 and 19.

FIG. 20 illustrates an example of the levels of the first 26 and second 30.1, 30.2 oscillatory signals, and associated signal components, and the signals to the front 36 and rear 46 driven shields, in accordance with measurement process.

In step (212), the process beginning with step (206) is repeated for all control conditions $\alpha$ and $\beta$.

Beginning with step (214), for all measures (j), measure $M_j^{\{X\}}$ and the reference normalized capacitance $C_{RN\_\gamma\xi}^{\{X\}}$ are calculated in step (216) as follows:

$$M_j^{\{X\}} = C_{RN\_\gamma\xi}^{\{X\}} = C_{N\_\gamma\xi}^{\{X\}} - C_{N\_--}^{\{X\}}$$

In step (218), the process beginning with step (214) is repeated for all measures (j).

Beginning with step (220), for all scenarios (i), the probability of measure $M_j^{\{X\}}$ given scenario $S_i$ is calculated in step (222) as follows:

$$\Pr(M_j^{(X)} | S_i) = \frac{\frac{1}{|M_j^{(X)} - M_j^i|}}{\sum_k \frac{1}{|M_j^{(X)} - M_j^k|}}$$

Assuming the measures $M_j^{\{X\}}$ for a given scenario $S_i$ to be independent, the probability of the combination of all measures $M_j^{\{X\}}$ is calculated in step (224), as follows:

$$\Pr(M_0, M_1, M_2, M_3, M_4, M_5, M_6, M_7 | S_i) = \prod_{j=0}^{7} \Pr(M_j^{(X)} | S_i)$$

The probability of scenario $S_i$ is then calculated in step (226) using the eight measures and Baye's rule as follows:

$$\Pr(S_i | M_0, M_1, M_2, M_3, M_4, M_5, M_6, M_7) = \frac{\Pr(M_0, M_1, M_2, M_3, M_4, M_5, M_6, M_7 | S_i)\Pr(S_i)}{\sum_{k=0}^{7} \Pr(M_0, M_1, M_2, M_3, M_4, M_5, M_6, M_7 | S_k)\Pr(S_k)}$$

In step (228), the process beginning with step (220) is repeated for all scenarios (i), thereby providing ten probabilities, i.e. probabilities of the ten scenarios, given the eight measures. The proximity of the unknown target {X} is then selected as the location associated with the proximity scenario having the highest probability, or a location interpolated from a function of the probabilities of the ten scenarios.

While specific embodiments have been described in detail in the foregoing detailed description and illustrated in the accompanying drawings, those with ordinary skill in the art will appreciate that various modifications and alternatives to those details could be developed in light of the overall teachings of the disclosure. Accordingly, the particular arrangements disclosed are meant to be illustrative only and not limiting as to the scope of the invention, which is to be given the full breadth of the appended claims and any and all equivalents thereof.

We claim:

1. A proximity sensor for sensing an electric-field-influencing media within a region of space, comprising:
    a. a first electrode, wherein said first electrode is conductive;
    b. a first oscillatory signal operatively connected to said first electrode;
    c. at least one second electrode separated from and located proximate to said first electrode so that an electric field between said first electrode and said at least one second electrode occupies said region of space, wherein said electric field is responsive to said first oscillatory signal, and said at least one second electrode is conductive;
    d. at least one second oscillatory signal operatively connected to said at least one second electrode, wherein said at least one second oscillatory signal is coherent with said first oscillatory signal, and said at least one second oscillatory signal comprises a plurality of second signal components each selected from the group consisting of a signal level and a signal phase relative to a phase of said first oscillatory signal, wherein each signal component is at a distinct time; and
    e. a circuit operatively connected to said first electrode, wherein said circuit senses a third signal from said first electrode, wherein said third signal comprises a plurality of third signal components, said third signal is responsive to said first oscillatory signal, said third signal is responsive to said at least one second oscillatory signal, said third signal is responsive to a proximity to said first electrode of the electric-field-influencing media, said third signal is selected from the group consisting of a current of said first oscillatory signal, a voltage of said first oscillatory signal, and a capacitance of said first electrode, respective third signal components are respectively responsive to respective signal components of said plurality of second signal components applied to said at least one second electrode, and said circuit generates from said plurality of third signal components a measure of the proximity of the electric-field-influencing media to said first electrode.

2. A proximity sensor for sensing an electric-field-influencing media within a region of space as recited in claim 1, wherein said first electrode is disposed along a first surface, and said at least one second electrode is disposed along said first surface outside a periphery of said first electrode.

3. A proximity sensor for sensing an electric-field-influencing media within a region of space as recited in claim 2, wherein said at least one second electrode comprises a plurality of second electrodes surrounding said first electrode, wherein said plurality of second electrodes are isolated from one another.

4. A proximity sensor for sensing an electric-field-influencing media within a region of space as recited in claim 1, wherein said at least one second oscillatory signal comprises a plurality of second oscillatory signals and respective second oscillatory signals of said plurality of second oscillatory signals are operatively connected to respective second electrodes of said plurality of second electrodes.

5. A proximity sensor for sensing an electric-field-influencing media within a region of space as recited in claim 1, wherein one of said plurality of second signal components is in phase with said first oscillatory signal and another of said second signal components is of opposite phase to said first oscillatory signal.

6. A proximity sensor for sensing an electric-field-influencing media within a region of space as recited in claim 1, wherein a signal characteristic of said at least one second oscillatory signal at one said at least one second electrode is independent of a signal characteristic of said at least one second oscillatory signal at another said at least one second electrode, wherein said signal characteristic is selected from the group consisting of a signal level and a signal phase.

7. A proximity sensor for sensing an electric-field-influencing media within a region of space as recited in claim 1, wherein said circuit generates a plurality of measures from said plurality of third signal components, and said circuit generates a likelihood of a proximity scenario responsive to said plurality of measures, wherein said proximity scenario is indicative of a proximity of the electric-field-influencing media to said first electrode.

8. A proximity sensor for sensing an electric-field-influencing media within a region of space as recited in claim 7, wherein said circuit generates a respective plurality of said likelihoods for a respective plurality of proximity scenarios, and selects a most likely proximity scenario from said plurality of proximity scenarios responsive to said plurality of likelihoods.

9. A proximity sensor for sensing an electric-field-influencing media within a region of space, comprising:
   a) a first electrode having a first side and a second side, wherein said first electrode is conductive and said first electrode is disposed along a first surface;
   b) a first oscillatory signal operatively connected to said first electrode; and
   c) a third electrode, wherein said third electrode is conductive, said third electrode is disposed along a second surface, said third electrode is proximate to and insulated from said first side of said first electrode between said first side of said first electrode and said region, and in a shielding mode said third electrode is operatively connected to said first oscillatory signal.

10. A proximity sensor for sensing an electric-field-influencing media within a region of space as recited in claim 9, wherein said first and third electrodes have substantially equal boundaries.

11. A proximity sensor for sensing an electric-field-influencing media within a region of space as recited in claim 9, wherein in a sensing mode a third signal from said first electrode is responsive to a proximity to said first side of said first electrode of the electric-field-influencing media, said third signal is responsive to said first oscillatory signal, and said third signal is selected from the group consisting of a current of said first oscillatory signal, a voltage of said first oscillatory signal, and a capacitance of said first electrode.

12. A proximity sensor for sensing an electric-field-influencing media within a region of space as recited in claim 11, wherein in said sensing mode, said third electrode is operatively connected to said first electrode.

13. A proximity sensor for sensing an electric-field-influencing media within a region of space as recited in claim 12, wherein in said sensing mode, said third electrode is operatively connect ed to said first electrode by a switch proximate to said first and third electrodes.

14. A proximity sensor for sensing an electric-field-influencing media within a region of space as recited in claim 11, wherein in said sensing mode, said third electrode is electrically floating.

15. A proximity sensor for sensing an electric-field-influencing media within a region of space as recited in claim 9, further comprising a fourth electrode, wherein said fourth electrode is conductive, said fourth electrode is disposed along a third surface, said fourth electrode is proximate to and insulated from said second side of said first electrode, and said fourth electrode is operatively coupled to said first oscillatory signal so as to shield said first electrode from the influence of an electric-field-influencing media proximate to said second side of said first electrode.

16. A proximity sensor for sensing an electric-field-influencing media within a region of space as recited in claim 15, wherein said second and third surfaces are substantially parallel to said first surface, and said second and third surfaces are sufficiently close to said first surface so that a fringing of an electric field is insubstantial between two electrodes selected from the group consisting of said first electrode, said third electrode, and said fourth electrode.

17. A proximity sensor for sensing an electric-field-influencing media within a region of space as recited in claim 15, wherein said first and fourth electrodes have substantially equal boundaries.

18. A proximity sensor for sensing an electric-field-influencing media within a region of space as recited in claim 17, wherein said boundary of said fourth electrode extends beyond said first electrode.

19. A method of sensing the proximity of an electric-field-influencing media within a region of space, comprising:
   a) applying a first oscillatory signal to a first electrode;
   b) applying at least one second oscillatory signal to a respective at least one second electrode, wherein said at least one second oscillatory signal comprises a plurality of second signal components each selected from the group consisting of a signal level and a signal phase relative to a phase of said first oscillatory signal, wherein each signal component is applied at a distinct time;

c) sensing a third signal from said first electrode, wherein said third signal comprises a plurality of third signal components, each respective said third signal component is responsive to a different respective second signal component, wherein said third signal is selected from the group consisting of a current of said first oscillatory signal, a voltage of said first oscillatory signal, and a capacitance of said first electrode; and d) generating from said plurality of third signal components a measure of the proximity of an electric-field-influencing media to said first electrode.

20. A method of sensing the proximity of an electric-field-influencing media within a region of space as recited in claim 19, wherein the operation of applying at least one second oscillatory signal to a respective at least one second electrode comprises applying a plurality of second oscillatory signals to a respective plurality of second electrodes.

21. A method of sensing the proximity of an electric-field-influencing media within a region of space as recited in claim 19, further comprising:

a) generating a plurality of measures from said plurality of third signal components;

b) establishing a plurality of proximity scenarios, wherein each proximity scenario comprises a different proximity of the electric-field-influencing media to said first electrode;

c) generating a plurality of likelihoods from said plurality of measures, wherein each respective likelihood of said plurality of likelihoods is the likelihood of a corresponding respective proximity scenario of said plurality of proximity scenarios; and d) selecting a most likely proximity scenario from said plurality of proximity scenarios, wherein the operation of selecting is responsive to said plurality of likelihoods.

22. A method of sensing the proximity of an electric-field-influencing media within a region of space, comprising:

a) applying a first oscillatory signal to a first electrode, wherein said first electrode has a first side and a second side;

b) in a shielding mode, applying said first oscillatory signal to a third electrode, wherein said third electrode is located between said first side of said first electrode and the region of space; and c) in a sensing mode, sensing a signal from said first electrode responsive to the proximity of the electric-field-influencing media to said first electrode, wherein said sensing mode and said shielding mode are mutually exclusive.

23. A method of sensing the proximity of an electric-field-influencing media within a region of space as recited in claim 22, wherein in said sensing mode, further comprising operatively connecting said third electrode to said first electrode.

24. A method of sensing the proximity of an electric-field-influencing media within a region of space as recited in claim 22, wherein in said sensing mode, further comprising electrically isolating said third electrode from said first electrode.

25. A method of sensing the proximity of an electric-field-influencing media within a region of space as recited in claim 22, further comprising applying said first oscillatory signal to a fourth electrode, wherein said fourth electrode is located proximate to said second side of said first electrode.

26. A method of sensing the proximity of an electric-field-influencing media within a region of space, comprising:

a) generating an electric field in the region of space by applying a first signal to a first electrode and by applying at least one second signal to a respective at least one second electrode;

b) measuring a third signal from said first electrode, wherein said third signal is responsive to at least one element selected from the group consisting of said first signal, said at least one second signal, a geometry of said first electrode, and a geometry of said at least one second electrode;

c) making at least one modification to said at least one second signal so as to modify said electric field;

d) measuring said third signal for each said at least one modification to said at least one second signal;

e) generating a measure of proximity of an electric-field-influencing media within the region of space from the measurements of said third signal.

* * * * *